United States Patent
Asakura

(10) Patent No.: US 12,003,873 B2
(45) Date of Patent: Jun. 4, 2024

(54) IMAGING APPARATUS AND ELECTRONIC DEVICE

(71) Applicant: Sony Semiconductor Solutions Corporation, Kanagawa (JP)

(72) Inventor: Luonghung Asakura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/732,925

(22) Filed: Apr. 29, 2022

(65) Prior Publication Data
US 2022/0272287 A1 Aug. 25, 2022

Related U.S. Application Data

(63) Continuation of application No. 17/281,423, filed as application No. PCT/JP2019/036339 on Sep. 17, 2019, now Pat. No. 11,405,568.

(30) Foreign Application Priority Data

Nov. 7, 2018 (JP) ................................ 2018-209461

(51) Int. Cl.
*H04N 25/59* (2023.01)
*H01L 27/146* (2006.01)
(Continued)

(52) U.S. Cl.
CPC ....... *H04N 25/59* (2023.01); *H01L 27/14641* (2013.01); *H04N 25/46* (2023.01);
(Continued)

(58) Field of Classification Search
CPC ...... H04N 5/347; H04N 5/3559; H04N 5/374; H04N 5/37452; H04N 5/378; H04N 25/46;
(Continued)

(56) References Cited

U.S. PATENT DOCUMENTS

| 7,924,333 | B2 * | 4/2011 | Yin ................... H01L 27/14603 348/308 |
| 10,638,067 | B2 | 4/2020 | Komal et al. |

(Continued)

FOREIGN PATENT DOCUMENTS

| JP | 2015-103958 A | 6/2015 |
| TW | 201351986 A | 12/2013 |

(Continued)

OTHER PUBLICATIONS

International Search Report (PCT/ISA/210), International Application No. PCT/JP2019/036339, dated Nov. 1, 2019.

(Continued)

*Primary Examiner* — Sinh Tran
*Assistant Examiner* — Chriss S Yoder, III
(74) *Attorney, Agent, or Firm* — Michael Best & Friedrich LLP

(57) ABSTRACT

A first and second pixel units that perform FD addition are provided. The first pixel unit includes: a first switch transistor of which one source/drain electrode is connected to an FD; and a reset transistor that is connected between another source/drain electrode of the first switch transistor and a power supply node. The second pixel unit includes: a second switch transistor of which one source/drain electrode is connected to an FD; a third switch transistor of which one source/drain electrode is connected to another source/drain electrode of the second switch transistor; and a capacitive element that is connected between another source/drain electrode of the third switch transistor and a reference potential node. The respective other source/drain electrodes of the first switch transistor and the second switch transistor are electrically connected with each other.

15 Claims, 30 Drawing Sheets

(51) Int. Cl.
*H04N 25/46* (2023.01)
*H04N 25/75* (2023.01)
*H04N 25/76* (2023.01)
*H04N 25/771* (2023.01)

(52) U.S. Cl.
CPC ............. *H04N 25/75* (2023.01); *H04N 25/76* (2023.01); *H04N 25/771* (2023.01); *H01L 27/1464* (2013.01)

(58) Field of Classification Search
CPC ........ H04N 25/59; H04N 25/75; H04N 25/76; H04N 25/771; H01L 27/14634; H01L 27/1464; H01L 27/14641
See application file for complete search history.

(56) References Cited

U.S. PATENT DOCUMENTS

| | | |
|---|---|---|
| 11,050,966 B2 | 6/2021 | Mori et al. |
| 2004/0251394 A1 | 12/2004 | Rhodes et al. |
| 2009/0045319 A1* | 2/2009 | Sugawa ............... H04N 25/771 |
| | | 250/208.1 |
| 2012/0312964 A1* | 12/2012 | Yamashita ........... H04N 25/778 |
| | | 250/208.1 |
| 2013/0050554 A1 | 2/2013 | Mabuchi |
| 2013/0248939 A1 | 9/2013 | Sakal et al. |
| 2014/0319322 A1* | 10/2014 | Mandier ................ H04N 25/75 |
| | | 250/208.1 |
| 2020/0243593 A1* | 7/2020 | Xu .................... H01L 27/14643 |

FOREIGN PATENT DOCUMENTS

| | | |
|---|---|---|
| WO | 2017/203839 A1 | 11/2017 |
| WO | 2018/105474 A1 | 6/2018 |
| WO | 2018/190363 A1 | 10/2018 |

OTHER PUBLICATIONS

Notification of Transmittal of the International Search Report and the Written Opinion of the International Searching Authority, or the Declaration (PCT/ISA/220), International Application No. PCT/JP2019/036339, dated Nov. 12, 2019.

Written Opinion of the International Search Authority (PCT/ISA/237), International Application No. PCT/JP2019/036339, dated Nov. 12, 2019.

* cited by examiner

TO ANALOG-DIGITAL CONVERSION UNIT

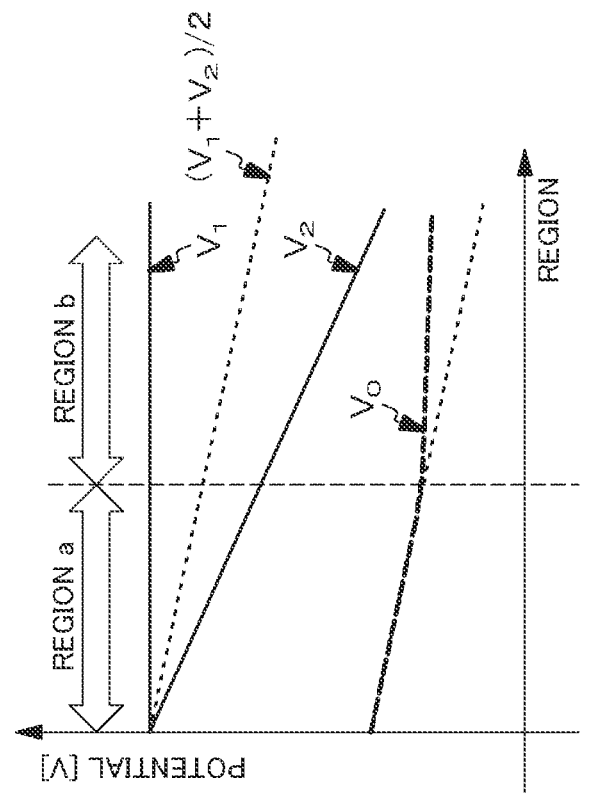
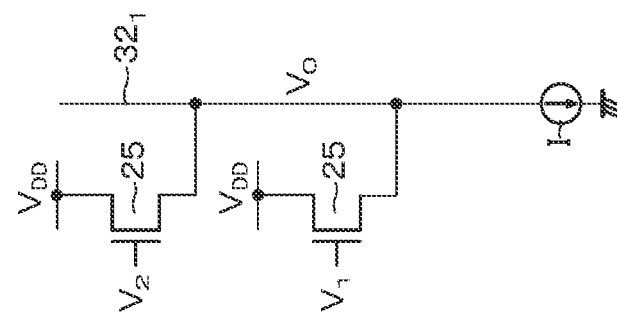
Fig. 11

Fig. 14
- HIGH CONVERSION EFFICIENCY
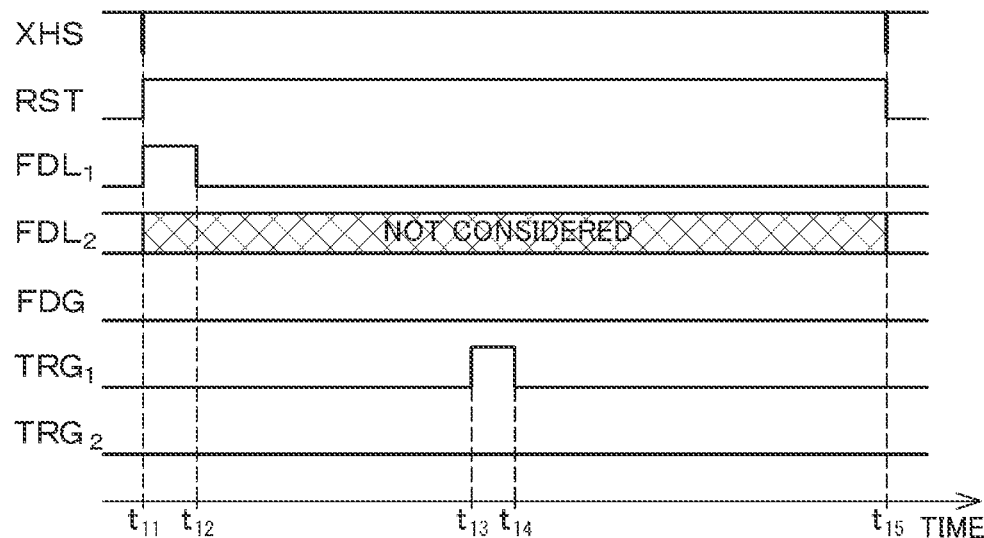
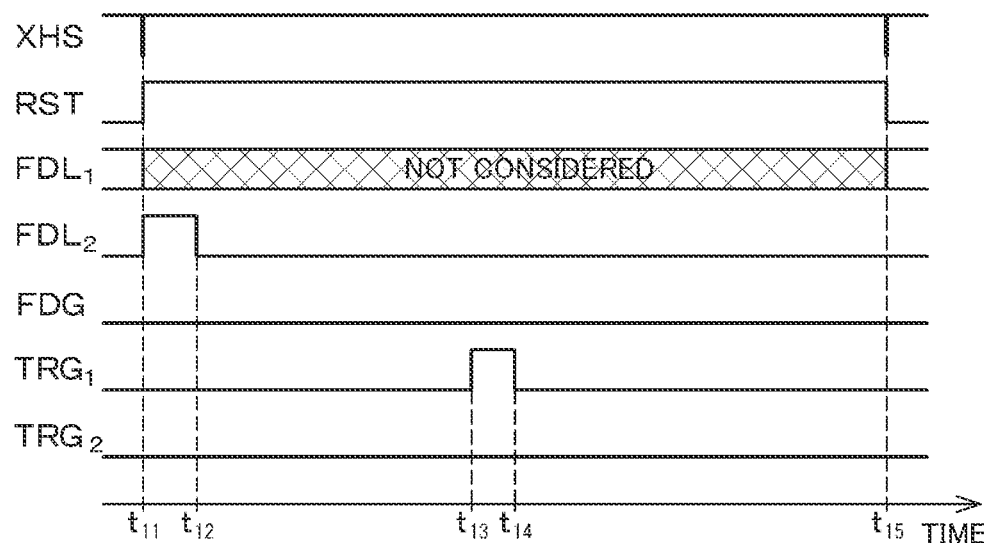

Fig. 15
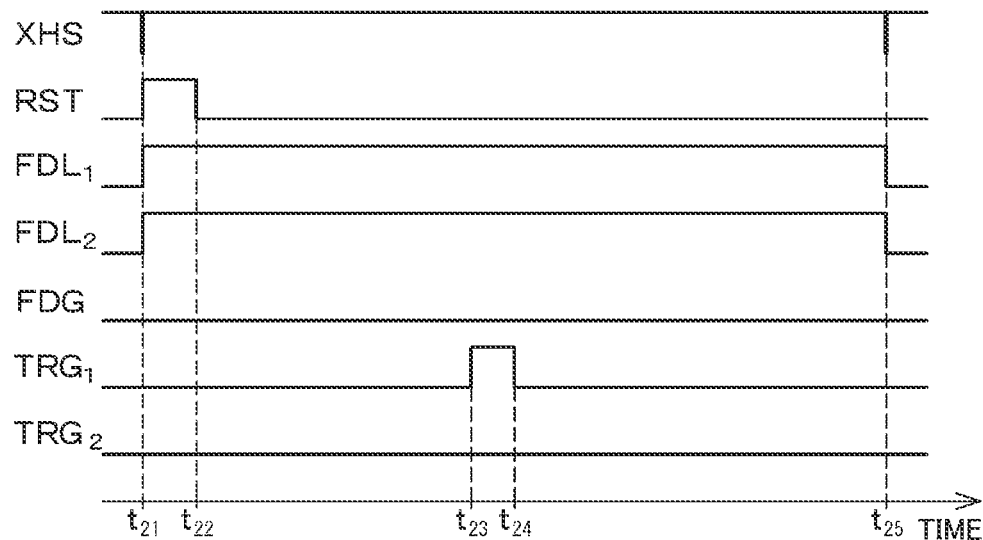
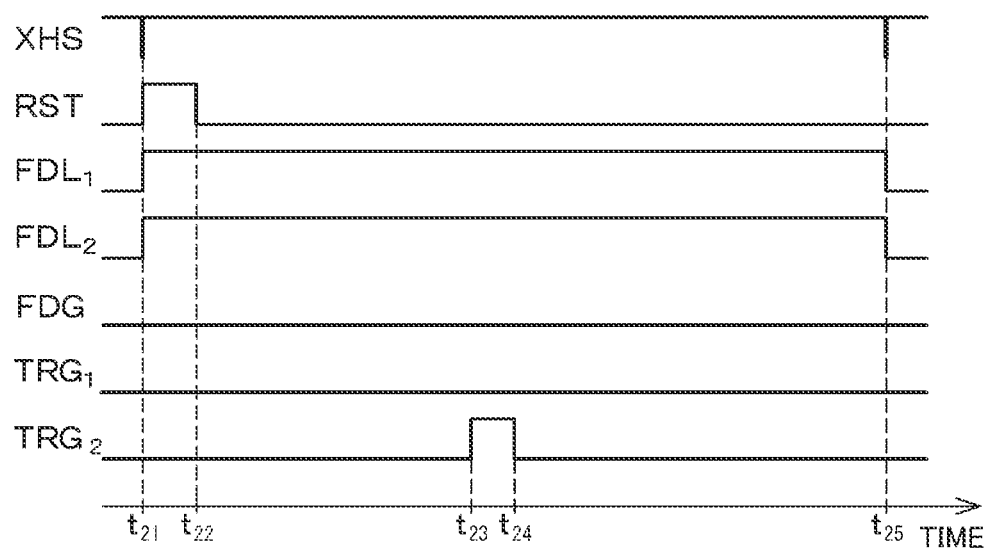

Fig. 16
- LOW CONVERSION EFFICIENCY
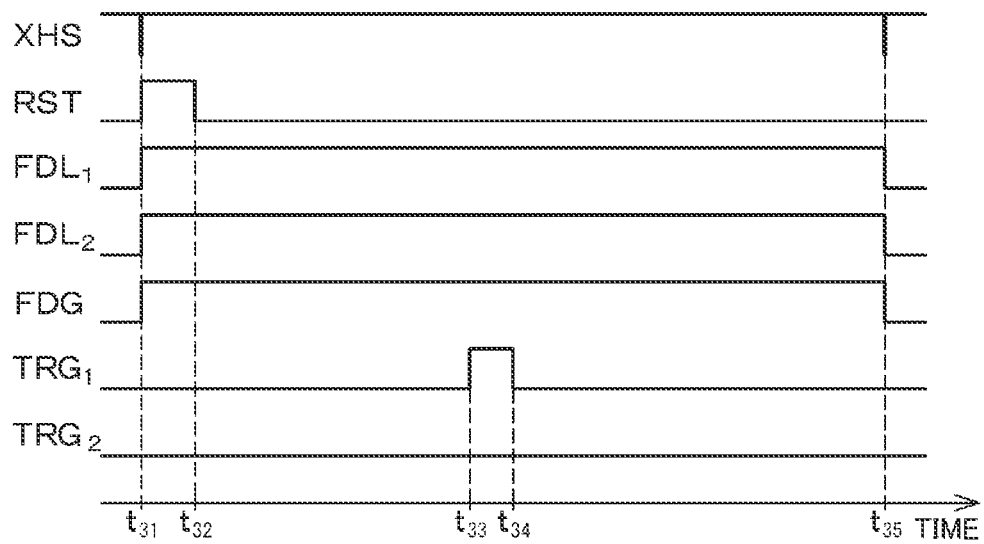
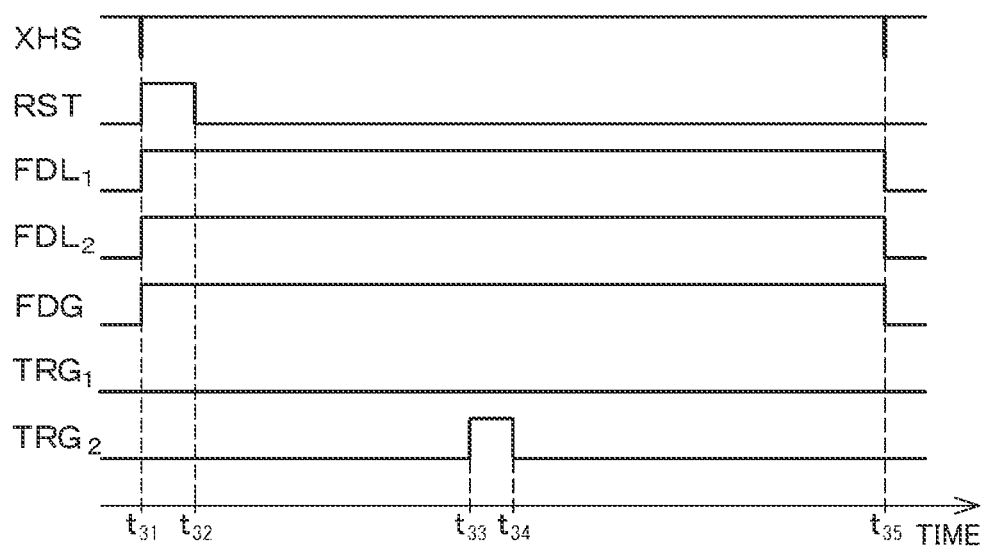

Fig. 17
A
・ADDITION AT INTERMEDIATE CONVERSION EFFICIENCY
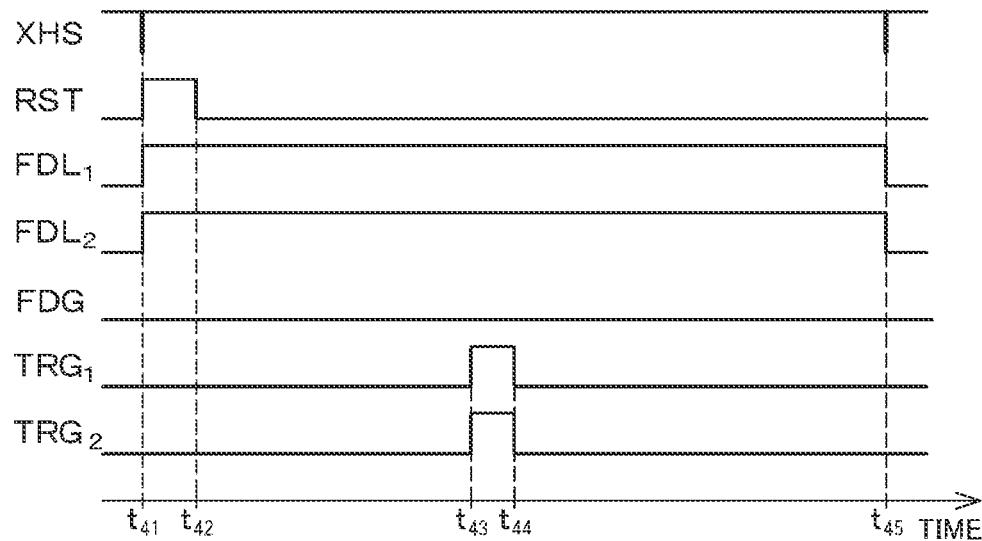
B
・ADDITION AT LOW CONVERSION EFFICIENCY
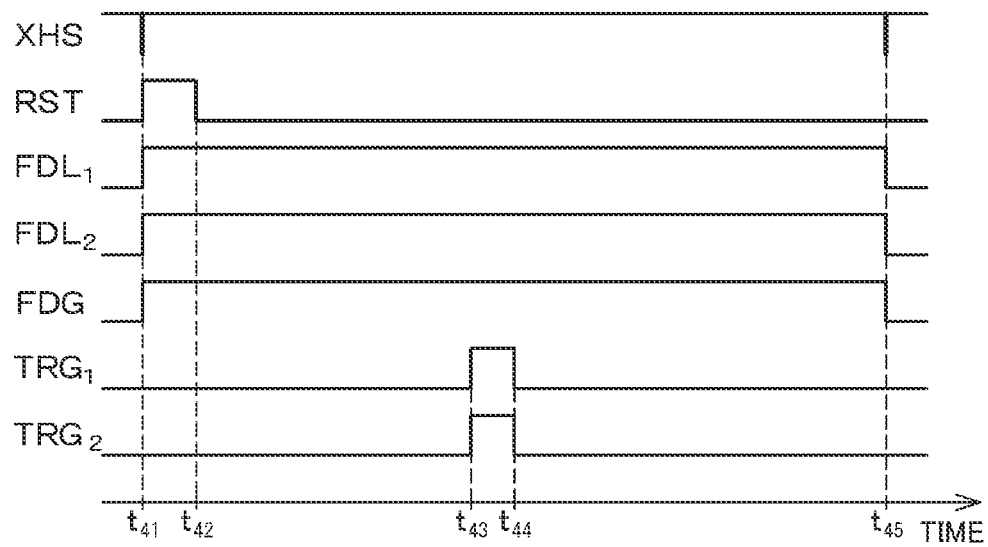

Fig. 25
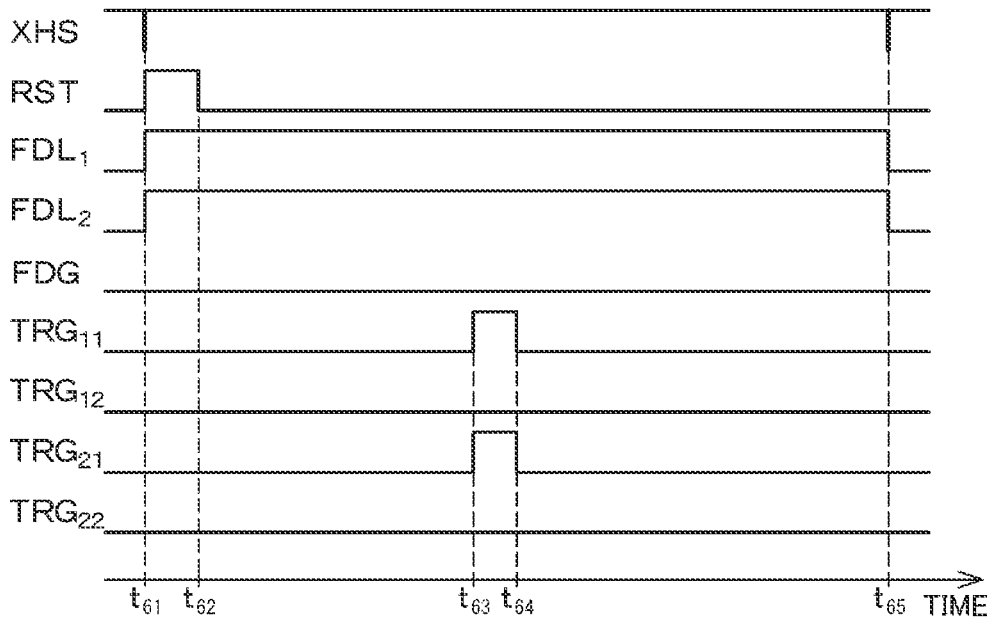
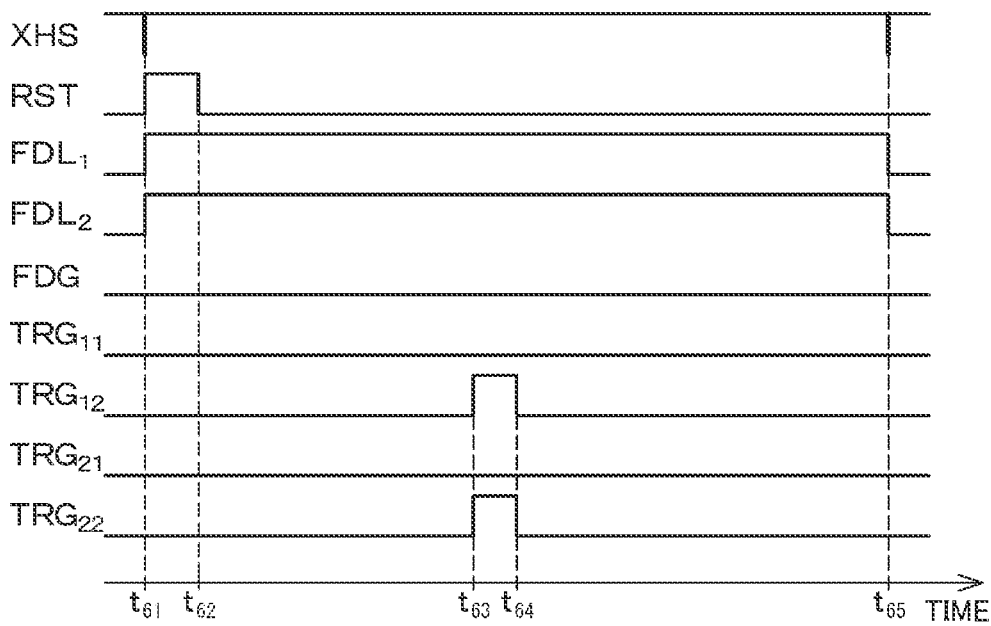

Fig. 26
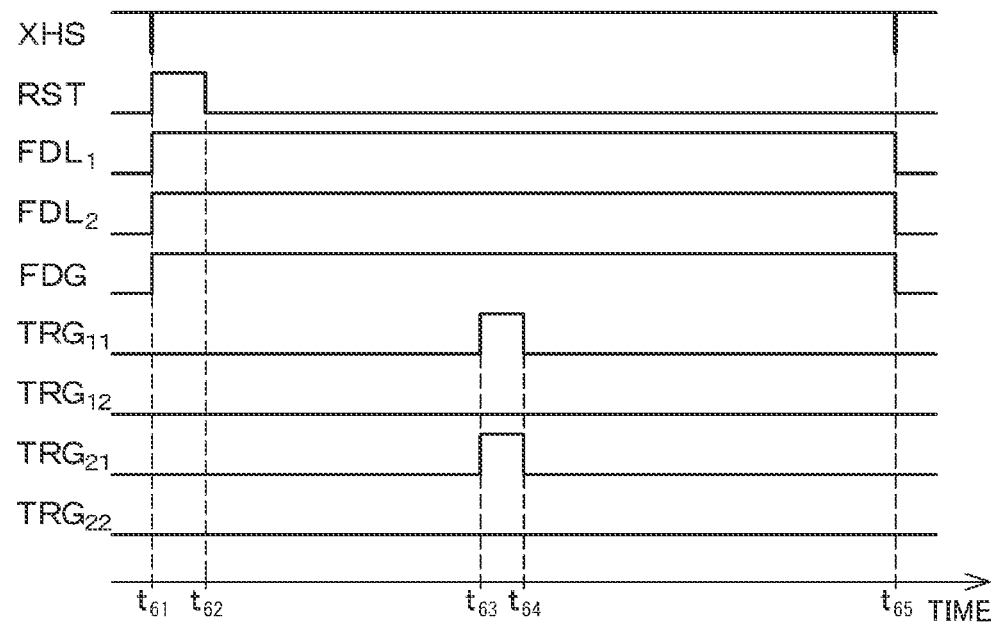
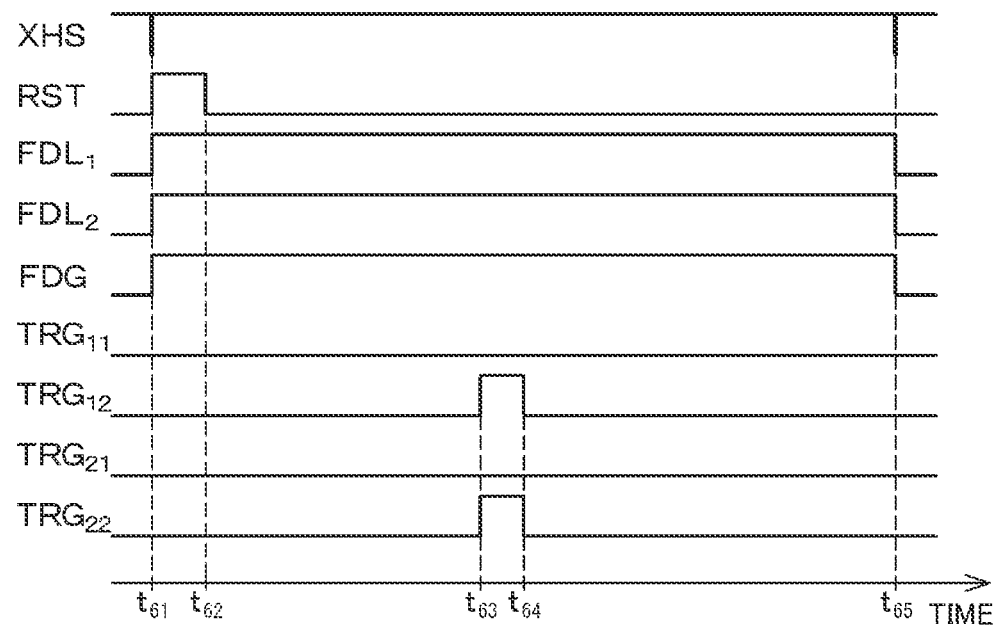

IMAGING APPARATUS AND ELECTRONIC DEVICE

CROSS REFERENCE TO RELATED APPLICATIONS

The present application is a Continuation of application Ser. No. 17/281,423, filed Mar. 30, 2021, which is a 371 National Stage Entry of International Application No.: PCT/JP2019/036339, filed on Sep. 17, 2019, which claims the benefit of Japanese Priority Patent Application JP 2018-209461 filed Nov. 7, 2018, the entire contents of which are incorporated herein by reference.

TECHNICAL FIELD

The present disclosure relates to an imaging apparatus and an electronic device.

BACKGROUND ART

An electronic device, such as a camera, equipped with an imaging apparatus, is demanded to support both a still image mode in which pixel signals are read out at a full angle of view of all the pixels of the imaging apparatus, and a moving image mode in which pixel signals are read out at a small angle of view, such as high definition (HD)/4K.

In the moving image mode, the pixel thinning readout and the addition readout or the like is performed. In a case of a simple thinning readout, spatial resolution and contrast sensitivity drop, hence addition readout, in which pixel signals of a plurality of pixels are added and read out, is preferable than the thinning readout. One addition readout method is an FD addition method, in which addition is performed among floating diffusions (FD) of pixels (e.g. see PTL 1).

CITATION LIST

Patent Literature

[PTL1]
JP 2015-103958 A

SUMMARY

Technical Problem

The prior art according to PTL1 is configured such that the FD nodes of two pixels are selectively connected via a switch to change conversion efficiency (efficiency to convert charges into voltage). Therefore in this prior art, when the switch is in the non-conduction state, parasitic capacitance of the line to short-circuit the FD nodes of the two pixels is not added to the FD nodes as extra capacitance, hence the conversion efficiency does not drop in the still image mode. However, a problem of this prior art is that the addition readout based on the FD addition can be performed only in the low conversion efficiency state.

With the foregoing in view, it is an object of the present disclosure to provide an imaging apparatus that can perform the addition readout based on the FD addition, even in a state other than the low conversion efficiency state, and an electronic device equipped with this imaging apparatus.

Solution to Problem

An imaging apparatus of the present disclosure to achieve the above object has a first pixel unit and a second pixel unit, each of which includes: a floating diffusion that converts charges, transferred from a light-receiving unit, into voltage, and selectively performs pixel addition that adds pixel signals by electrically connecting the floating diffusion between pixels.

The first pixel unit includes: a first switch transistor of which one source/drain electrode is connected to a floating diffusion; and a reset transistor that is connected between another source/drain electrode of the first switch transistor and a power supply node.

The second pixel unit includes: a second switch transistor of which one source/drain electrode is connected to a floating diffusion; a third switch transistor of which one source/drain electrode is connected to another source/drain electrode of the second switch transistor; and a capacitive element that is connected between another source/drain electrode of the third switch transistor and a reference potential node.

The respective other source/drain electrodes of the first switch transistor and the second switch transistor are electrically connected.

Furthermore, an electronic device of the present disclosure to achieve the above object includes the imaging apparatus having the above configuration.

BRIEF DESCRIPTION OF DRAWINGS

FIG. 11 is an explanatory diagram for describing a linearity problem of the SF addition method.

FIG. 14 indicates timing charts for describing an operation in the case of high conversion efficiency in the still image mode without pixel addition.

FIG. 15 indicates timing charts for describing operation in the case of intermediate conversion efficiency in the still image mode without pixel addition.

FIG. 16 indicates timing charts for describing operation in the case of low conversion efficiency in the still image mode without pixel addition.

FIG. 17A indicates a timing chart for describing operation in the case of addition readout at intermediate conversion efficiency, and FIG. 17B indicates a timing chart for describing operation in the case of addition readout at low conversion efficiency.

FIG. 25A indicates a timing chart for describing operation in the case of addition readout of pixel 1 and pixel 3 at intermediate conversion efficiency, and FIG. 25B indicates a timing chart for describing operation in the case of addition readout of pixel 2 and pixel 4 at intermediate conversion efficiency.

FIG. 26A indicates a timing chart for describing operation in the case of addition readout of pixel 1 and pixel 3 at low conversion efficiency, and FIG. 26B indicates a timing chart for describing operation in the case of addition readout of pixel 2 and pixel 4 at low conversion efficiency.

DESCRIPTION OF EMBODIMENTS

Figure 1:
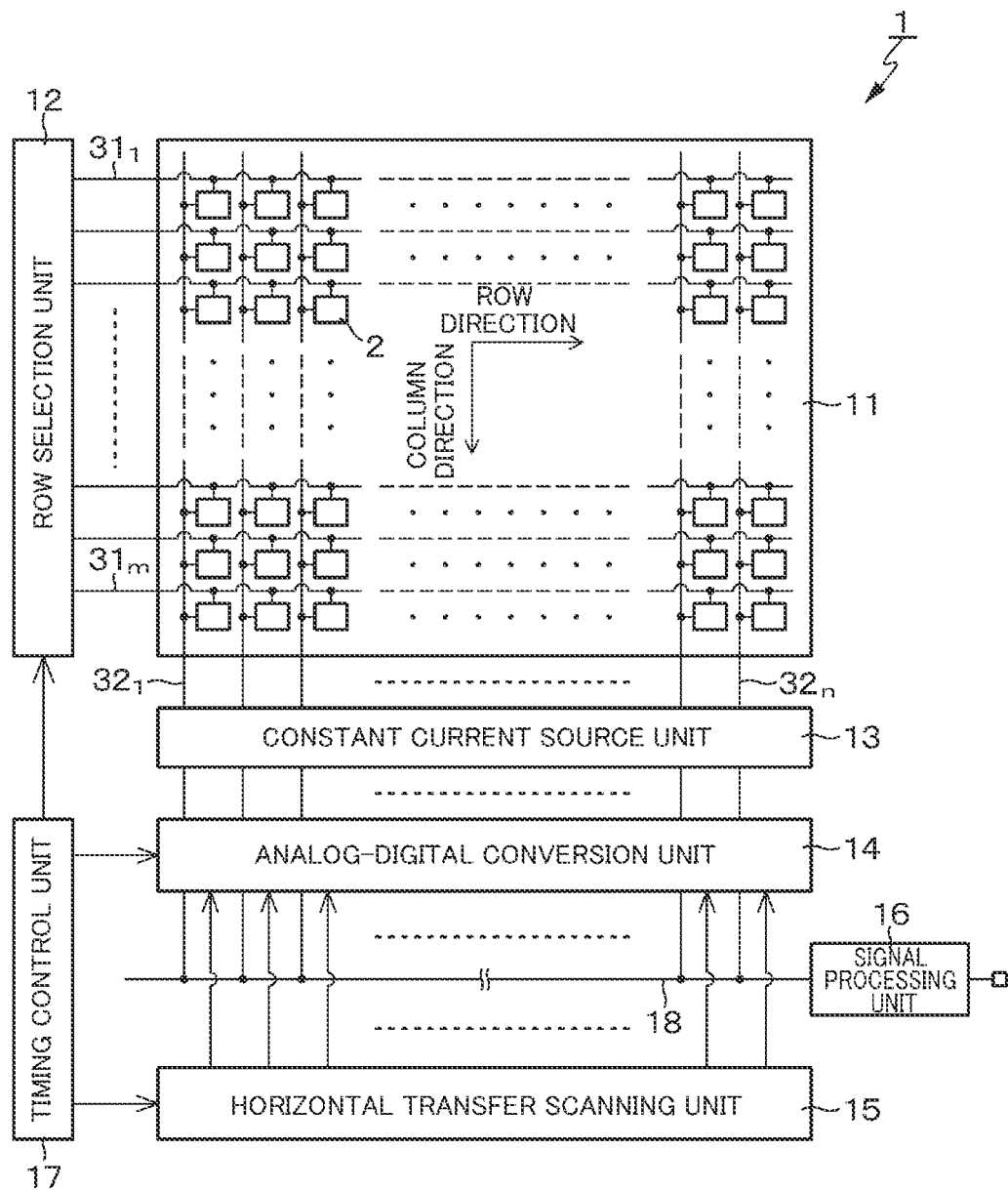
FIG. 1 is a block diagram depicting an overview of a basic configuration of a CMOS image sensor, which is an example of the imaging apparatus of the present disclosure.

Embodiments of the technique according to the present disclosure (hereafter referred to as "embodiment") will be described with reference to the drawings. The technique of the present disclosure is not limited to the embodiment. In the following description, identical elements or elements having identical functions are denoted with a same reference sign, and redundant explanation is omitted. Description will be performed according to the following sequence.

1. General description of imaging apparatus and electronic device of present disclosure
2. Imaging apparatus of present disclosure
2-1. Configuration example of CMOS image sensor
2-2. Circuit configuration example of pixel
2-3. Configuration example of analog-digital conversion unit
2-4. Chip structure
2-4-1. Planar type chip structure (planar structure)
2-4-2. Stack type chip structure (stack structure)
2-5. Addition readout of pixel signals
2-5-1. Logic addition method
2-5-2. AD addition method
2-5-3. SF addition method
2-5-4. FD addition method
2-5-5. Comparison of each addition system in terms of power consumption and linearity
2-5-6. Linearity problem of SF addition method
2-5-7. Deterioration of circuit noise electron count of input conversion of FD addition method
3. Embodiment of present disclosure
3-1. First embodiment (example when each of first and second pixel units is constituted of a single pixel)
3-2. Second embodiment (example when each of the first and second pixel units is constituted of the plurality of pixels, and FD is shared by a plurality of pixels)
4. Modification
5. Applications
6. Electronic device of present disclosure (example of imaging apparatus)
7. Possible configuration of present disclosure General Description on Imaging Apparatus and Electronic Device of Present Disclosure In an imaging apparatus and an electronic device of the present disclosure, it may be configured such that in a case where pixel addition is not performed, a first pixel unit or a second pixel unit implements high conversion efficiency for the conversion efficiency of a floating diffusion when a first switch transistor or a second switch transistor is in a non-conduction state.

In the imaging apparatus and the electronic device of the present disclosure, including the above mentioned preferred configuration, it may be configured such that in a case where the pixel addition is not performed, the first pixel unit and the second pixel unit implement high conversion efficiency for the conversion efficiency of the floating diffusion when the first switch transistor and the second switch transistor are in the non-conduction state respectively. Further, it may be configured such that in the case where the pixel addition is not performed, the first pixel unit and the second pixel unit implement low conversion efficiency for the conversion efficiency of the floating diffusion when the first switch transistor, the second switch transistor and a third switch transistor are all in a conduction state.

In the imaging apparatus and the electronic device of the present disclosure, including the above mentioned preferable configuration, it may be configured such that the first pixel unit and the second pixel unit perform the pixel addition, and implement intermediate conversion efficiency for the conversion efficiency of the floating diffusion when the first switch transistor and the second transistor are both in the conduction state. Further, it may be configured such that the first pixel unit and the second pixel unit implement low conversion efficiency for the conversion efficiency of the floating diffusion when the third switch transistor is in the conduction state.

In the imaging apparatus and the electronic device of the present disclosure, including the above mentioned preferred configuration, it may be configured that a capacitive element is disposed so as to be divided into each pixel of the first pixel unit and the second pixel unit. Further, the capacitive element may be implemented by coupling capacitance between metal lines.

In the imaging apparatus and the electronic device of the present disclosure, including the above mentioned preferred configuration, it may be configured such that each of the first pixel unit and the second pixel unit is constituted of a plurality of pixels, and a floating diffusion is shared by the plurality of pixels. Further, the first pixel unit and the second pixel unit may perform pixel addition among pixels having a same color.

In the imaging apparatus and the electronic device of the present disclosure, including the above mentioned preferred configuration, it may be configured such that composing elements of the first pixel unit and composing elements of the second pixel unit have pixel layout ensuring symmetry with respect to the center line between the first pixel unit and the second pixel unit. Further, it may be configured such that each floating diffusion of the first pixel unit and the second pixel unit is disposed at a position that is closer to the center line between the first pixel unit and the second pixel unit than each center of the first pixel unit and the second pixel unit respectively.

In the imaging apparatus and the electronic device of the present disclosure, including the above mentioned preferred configuration, it may be configured such that each of the first pixel unit and the second pixel unit has a back-illuminated pixel structure.

Imaging Apparatus of Present Disclosure

A basic configuration of an imaging apparatus to which the technique according to the present disclosure is applied (that is, the imaging apparatus of the present disclosure) will be described. Here, as an example, the imaging apparatus will be described using a complementary metal oxide semiconductor (CMOS) image sensor, which is a kind of X-Y address type imaging apparatus. The CMOS image sensor is an image sensor that is fabricated by applying or by partially using a CMOS process.

[Configuration Example of CMOS Image Sensor]

FIG. 1 is a block diagram depicting an overview of a basic configuration of the CMOS image sensor, which is an example of the imaging apparatus of the present disclosure.

The CMOS image sensor 1 according to this example is constituted of a pixel array unit 11 and a peripheral circuit portion of the pixel array unit 11. In the pixel array unit 11, a pixel 2 which includes a light-receiving portion (photoelectric conversion portion) is two-dimensionally disposed in a row direction and a column direction, that is, in a matrix. Here, the row direction refers to the direction where the pixels 2 are arranged in a pixel row (horizontal direction), and the column direction refers to a direction where the pixels 2 are arranged in a pixel column (vertical direction). The pixel 2 performs photoelectric conversion so as to generate and store photo charges in accordance with the quantity of received light.

The peripheral circuit portion of the pixel array unit 11 is constituted of a row selection unit 12, a constant current source unit 13, an analog-digital conversion unit 14, a horizontal transfer scanning unit 15, a signal processing unit 16, a timing control unit 17, and the like.

In the matrix of pixel arrays of the pixel array unit 11, pixel control lines $31_1$ to $31_m$ (collectively referred to as "pixel control line 31" in some cases) are wired in a row direction for each pixel row. Further, vertical signal lines $32_1$ to $32_n$ (collectively referred to as "vertical signal line 32" in some cases) are wired in the column direction for each pixel column. The pixel control line 31 transmits a drive signal for performing driving when a signal is read out from the pixel 2. In FIG. 1, the pixel control line 31 is illustrated as one line, but is not limited to one line. One end of the pixel control line 31 is connected to a corresponding output end of each row of the row selection unit 12.

Now each circuit of the peripheral circuit portion of the pixel array unit 11, that is, the row selection unit 12, the constant current source unit 13, the analog-digital conversion unit 14, the horizontal transfer scanning unit 15, the signal processing unit 16 and the timing control unit 17 will be described.

The row selection unit 12 is constituted of a shift register, an address decoder and the like, and controls scanning of a pixel row and an address of a pixel row when each pixel 2 of the pixel array unit 11 is selected. The row selection unit 12 normally includes two scanning systems: a readout scanning system and a sweeping scanning system, although an illustration of a specific configuration thereof is omitted here.

The readout scanning system sequentially selects and scans the pixels 2 of the pixel array unit 11 in row units, in order to read out pixel signals from the pixel 2. The pixel signal readout from the pixel 2 is an analog signal.

For a readout row to be read out by the readout scanning system, the sweeping scanning system performs sweeping scanning at a timing prior to the execution of the readout scanning by the shutter speed time.

By the sweeping scanning system performing sweeping scanning, unnecessary charges are swept from the photoelectric conversion portion of the pixel 2 in the readout row, whereby the photoelectric conversion portion is reset. By the sweeping scanning system sweeping unnecessary charging (resetting), an electronic shutter operation is performed. The electronic shutter operation here refers to as an operation of sweeping photo charges of the photoelectric conversion portion, and starting a new exposure (starting to store charges).

The constant current source unit 13 includes a plurality of current sources I each of which is connected to each vertical signal line $32_1$ to $32_n$ respectively for each pixel row, and is constituted of an MOS transistor, for example, and supplies bias current to each pixel 2 of a pixel row selected and scanned by the row selection unit 12 via each vertical signal line $32_1$ to $32_n$ respectively.

The analog-digital conversion unit 14 is constituted of a set of a plurality of analog-digital convertors disposed for each pixel column, for example, so as to correspond to each pixel column of the pixel array unit 11. The analog-digital conversion unit 14 is a column-parallel type analog digital conversion unit, that converts an analog pixel signal, which is outputted via each vertical signal line $32_1$ to $32_n$ for each pixel column respectively, into an N-bit digital signal.

For the analog-digital convertor of the column-parallel analog-digital conversion unit 14, a single slope type analog-digital convertor, which is an example of a reference signal comparison type analog-digital convertor, can be used, for example. However, the analog-digital convertor is not limited to the single slope type analog-digital convertor, but may be a sequential comparison type analog-digital convertor, a delta-sigma modulation type (ΔΣ modulation type) analog-digital convertor, or the like.

The horizontal transfer scanning unit 15 is constituted of a shift register, an address decoder, and the like, and controls scanning of a pixel column and an address of a pixel column when a signal of each pixel 2 of the pixel array unit 11 is readout. Under control of the horizontal transfer scanning unit 15, the pixel signals, converted into digital signals by the analog-digital conversion unit 14, are readout to the horizontal transfer line 18 having a 2N-bit width in pixel column units.

The signal processing unit 16 performs predetermined signal processing on digital pixel signals supplied via the horizontal transfer line 18, and generates two-dimensional image data. For example, the signal processing unit 16 corrects longitudinal line defects and point defects, clamps a signal, and performs digital signal processing, such as parallel-serial conversion, compression, encoding, addition, averaging and intermittent operation. The signal processing unit 16 outputs the generated image data to a device in a subsequent stage, as an output signal of this CMOS image sensor 1.

The timing control unit 17 generates various timing signals, clock signals, control signals, and the like, and based on these generated signals, controls driving of the row selection unit 12, the constant current source unit 13, the analog-digital conversion unit 14, the horizontal transfer scanning unit 15, the signal processing unit 16, and the like.

[Circuit Configuration Example of Pixel]

Figure 2:
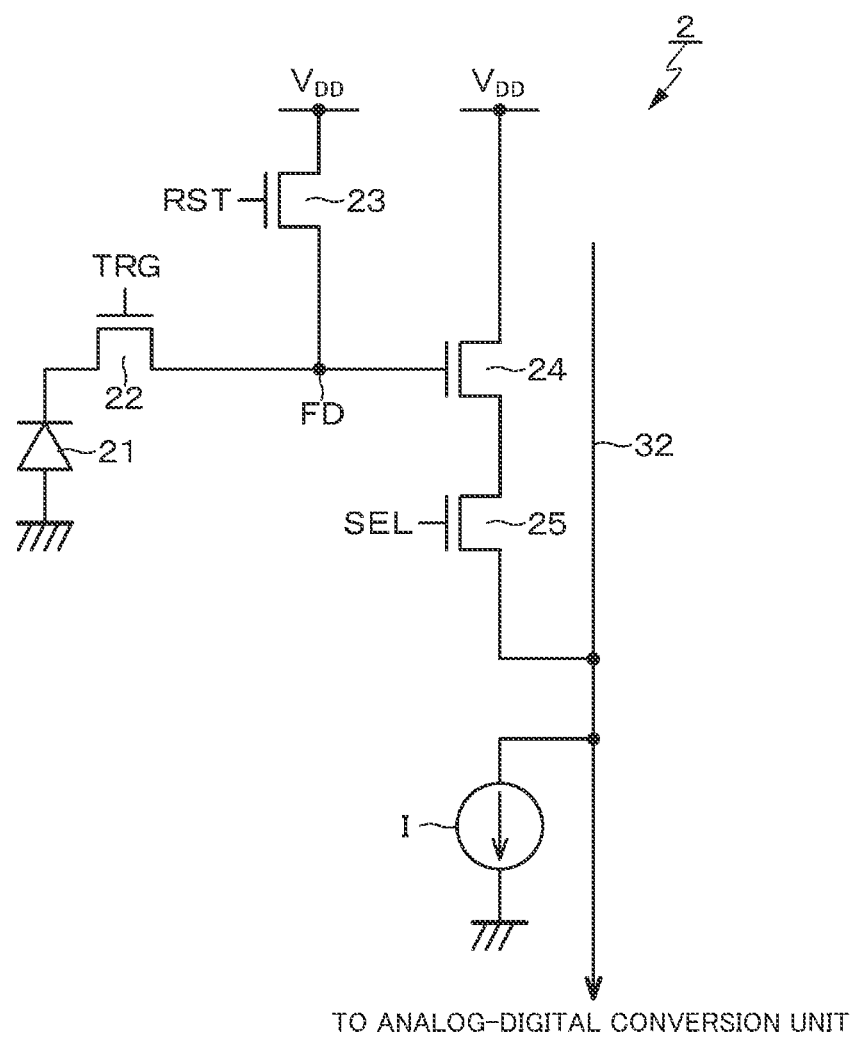
FIG. 2 is a circuit diagram depicting an example of a circuit configuration of a pixel.

FIG. 2 is a circuit diagram depicting an example of a circuit configuration of the pixel 2. The pixel 2 includes a photodiode 21, for example, as a photoelectric conversion portion, which is a light-receiving portion. In addition to the photodiode 21, a pixel 2 includes a transfer transistor 22, a reset transistor 23, an amplification transistor 24 and a selection transistor 25.

For each of the four transistors (transfer transistor 22, reset transistor 23, amplification transistor 24 and selection transistor 25), an N channel MOS field effect transistor (FET) is used. By constituting the pixel 2 only by N channel transistors, area efficiency and reduction of a number of processing steps can be optimized. It should be noted that the combination of conduction types of the four transistors 22 to 25 exemplified here is merely an example, and is not limited to this combination.

To the pixel 2, a plurality of control lines are sharedly wired as the above mentioned pixel control lines 31 to each pixel 2 of a same pixel row. The plurality of control lines are connected to the output end corresponding to each pixel row of the row selection unit 12 in a pixel row unit. The row selection unit 12 outputs a transfer signal TRG, a reset signal RST and a selection signal SEL to the plurality of control lines when necessary.

The photodiode 21, of which anode electrode is connected to a low potential side power supply (e.g. ground), photo-electrically converts the received light into photo charges (photo electrons in this case) for a charge quantity in accordance with the quantity of the received light, and stores the photo charges. A cathode electrode of the photodiode 21 is electrically connected to a gate electrode of the amplification transistor 24 via the transfer transistor 22. Here, the region where the gate electrode of the amplification transistor 24 is electrically connected is a floating diffusion (floating diffusion region/impurity diffusion region) FD. The floating diffusion FD is a charge-voltage conversion unit that converts charges into voltage.

A transfer signal TRG, of which high level (e.g. $V_{DD}$ level) becomes active, is supplied from the row selection unit 12 to a gate electrode of the transfer transistor 22. When the transfer transistor 22 responds to the transfer signal TRG and becomes the conduction state, the photoelectric conversion is performed in the photodiode 21, and the photo charges stored in the photodiode 21 are transferred to the floating diffusion FD.

The reset transistor 23 is connected between a node of the high potential side power supply voltage $V_{DD}$ and the floating diffusion FD. A reset signal RST, of which high level becomes active, is supplied from the row selection unit 12 to a gate electrode of the reset transistor 23. The reset transistor 23 responds to the reset signal RST and becomes the conduction state, and resets the floating diffusion FD by sweeping out the charges of the floating diffusion FD to the node of the voltage $V_{DD}$.

A gate electrode of the amplification transistor 24 is connected to the floating diffusion FD, and a drain electrode thereof is connected to the node of the high potential side power supply voltage $V_{DD}$ respectively. The amplification transistor 24 becomes an input unit of a source follower which reads out signals acquired by the photoelectric conversion of the photodiode 21. In other words, a source electrode of the amplification transistor 24 is connected to the vertical signal line 32 via the selection transistor 25. Then the amplification transistor 24 and the current source I connected to one end of the vertical signal line 32, constitute a source-follower that converts the voltage of the floating diffusion FD into the potential of the vertical signal line 32.

A drain electrode of the selection transistor 25 is connected to the source electrode of the amplification transistor 24, and a source electrode thereof is connected to the vertical signal line 32. A selection signal SEL, of which high level becomes active, is supplied from the row selection unit 12 to a gate electrode of the selection transistor 25. When the selection transistor 25 responds to the selection signal SEL and becomes the conduction state, the selection transistor 25 transmits a signal, which is outputted from the amplification transistor 24 with the pixel 2 as the selection state, to the vertical signal line 32.

The selection transistor 25 may have a circuit configuration in which the selection transistor 25 is connected between the node of the high potential side power supply voltage $V_{DD}$ and the drain electrode of the amplification transistor 24. In the present example, the pixel circuit of the pixel 2 is constituted of the transfer transistor 22, the reset transistor 23, the amplification transistor 24 and the selection transistor 25. In other words, in this example, a 4Tr configuration constituted of four transistors (Tr) is used, but the pixel circuit of the pixel 2 is not limited to this. For example, a 3Tr configuration, in which the selection transistor 25 is omitted and the amplification transistor 24 has the function of the selection transistor 25, may be used, or a 5Tr or more transistors may be used if necessary.

[Configuration Example of Analog-Digital Conversion Unit]

Figure 3:
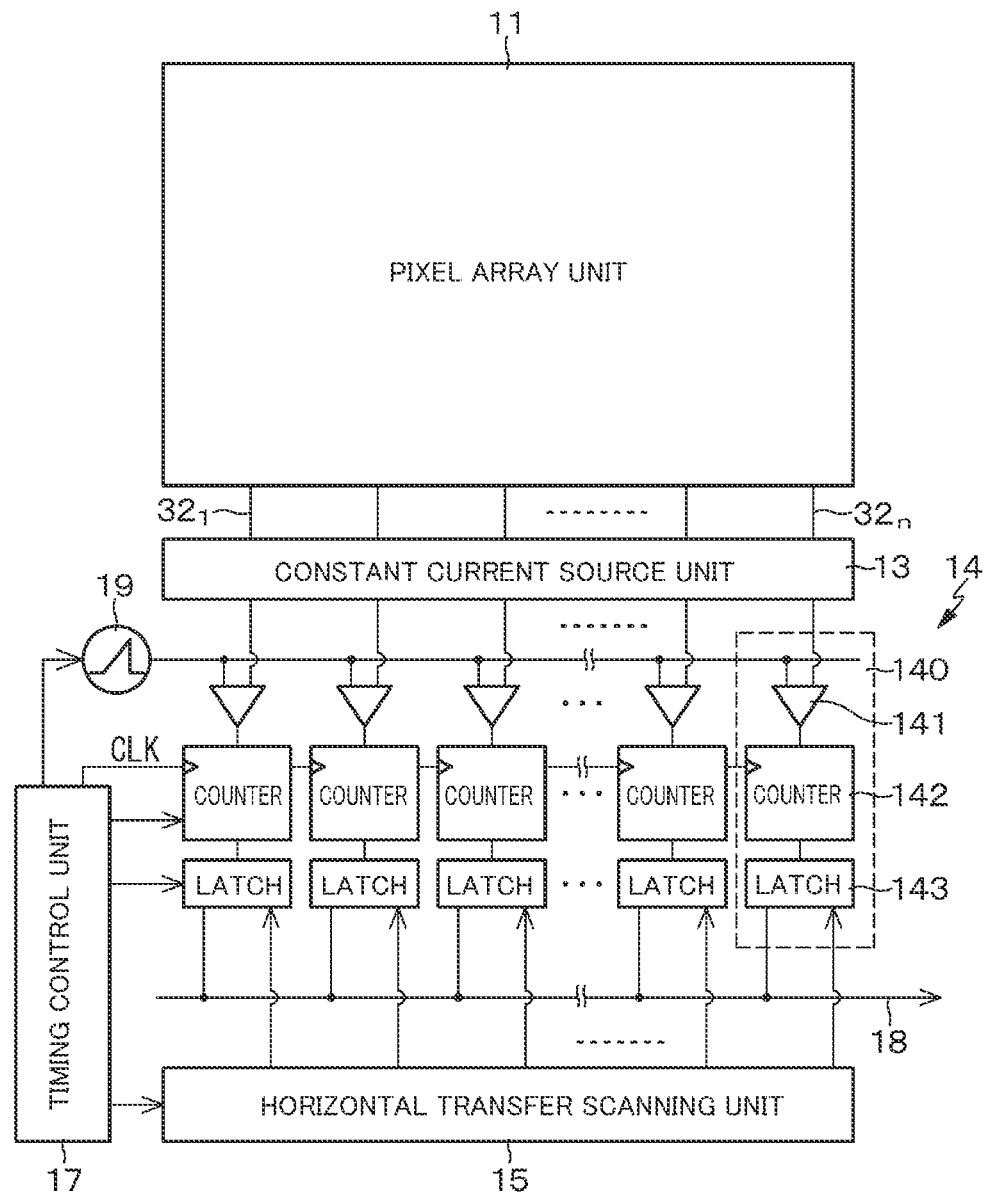
FIG. 3 is a block diagram depicting an example of a configuration of a column-parallel analog-digital conversion unit included in the CMOS image sensor.

A configuration example of the column-parallel analog-digital conversion unit 14 will be described next. FIG. 3 is a block diagram depicting an example of the configuration of the column-parallel analog-digital conversion unit 14. The analog-digital conversion unit 14 of the CMOS image sensor 1 of the present disclosure is constituted of a set of a plurality of single slope type analog-digital convertors, which are disposed so as to correspond to the vertical signal lines $32_1$ to $32_n$ respectively. Here, the single slope type analog-digital convertor 140 on the n-th column will be described as an example.

The single slope type analog-digital convertor 140 has a circuit configuration which includes a comparator 141, a counter circuit 142 and a latch circuit 143. In the single slope type analog-digital convertor 140, a reference signal, having a ramp waveform (slope waveform), in which the voltage value linearly changes as time elapses, is used. The reference signal having a ramp waveform is generated by the reference signal generation unit 19. The reference signal generation unit 19 can be configured using a digital-analog conversion (DAC) circuit.

The comparator 141 compares an analog pixel signal readout from the pixel 2 (comparison input), with a reference signal having a ramp waveform which is generated by a reference signal generation unit 19 (reference input). The output of the comparator 141 becomes a first state (e.g. high level) when the reference signal is larger than the pixel signal, and becomes a second state (e.g. low level) when the reference signal is not larger than the pixel signal, for example. Thereby as a comparison result, the comparator 141 outputs a pulse signal in accordance with the signal level of the pixel signal, specifically, a pulse signal having a pulse width corresponding to the magnitude of the signal level.

A clock signal CLK is supplied from the timing control unit 17 to the counter circuit 142 at the same timing as the timing when the supply of the reference signal to the comparator 141 is started. Then the counter circuit 142 performs count operation synchronizing with the clock signal CLK, so as to measure the period during the pulse width of the output pulse of the comparator 141, that is, the period from the start of the comparison operation to the end of the comparison operation. The count result (count value) of the counter circuit 142 becomes a digital value generated by digitizing the analog pixel signal.

The latch circuit 143 holds (latches) the digital value of the count result of the counter circuit 142. Further, the latch circuit 143 performs correlated double sampling (CDS), which is an example of noise removal processing, by determining the difference between the count value in the D phase corresponding to the pixel signal at the signal live and the count value in the P phase corresponding to the pixel signal at the reset level. Then the latched digital value is outputted to the horizontal transfer line 18 based on the driving by the horizontal transfer scanning unit 15.

As mentioned above, in the column-parallel analog-digital conversion unit 14 constituted of a set of single slope type analog-digital convertors 140, a digital value is acquired from the time information until change occurs to the magnitude relationship between: the reference signal of an analog value which is generated by the reference signal generation unit 19 and the linearity changes; and the analog pixel signal outputted from the pixel 2. In the above example, the analog-digital conversion unit 14, where the analog-digital convertors 140 are disposed in a one-to-one relationship with the pixel column, was described as an example, but an analog-digital conversion unit 14, where each analog-digital convertor 140 was disposed so as to correspond to a unit of a plurality of pixel columns, may be used.

[Chip Structure]

For the chip (semiconductor integrated circuit) structure of the CMOS image sensor 1 having the above configuration, a planar type chip structure or a stack type chip structure may be used, for example. The planar type chip structure and the stack type chip structure will be described in detail.

Planar Type Chip Structure

Figure 4:
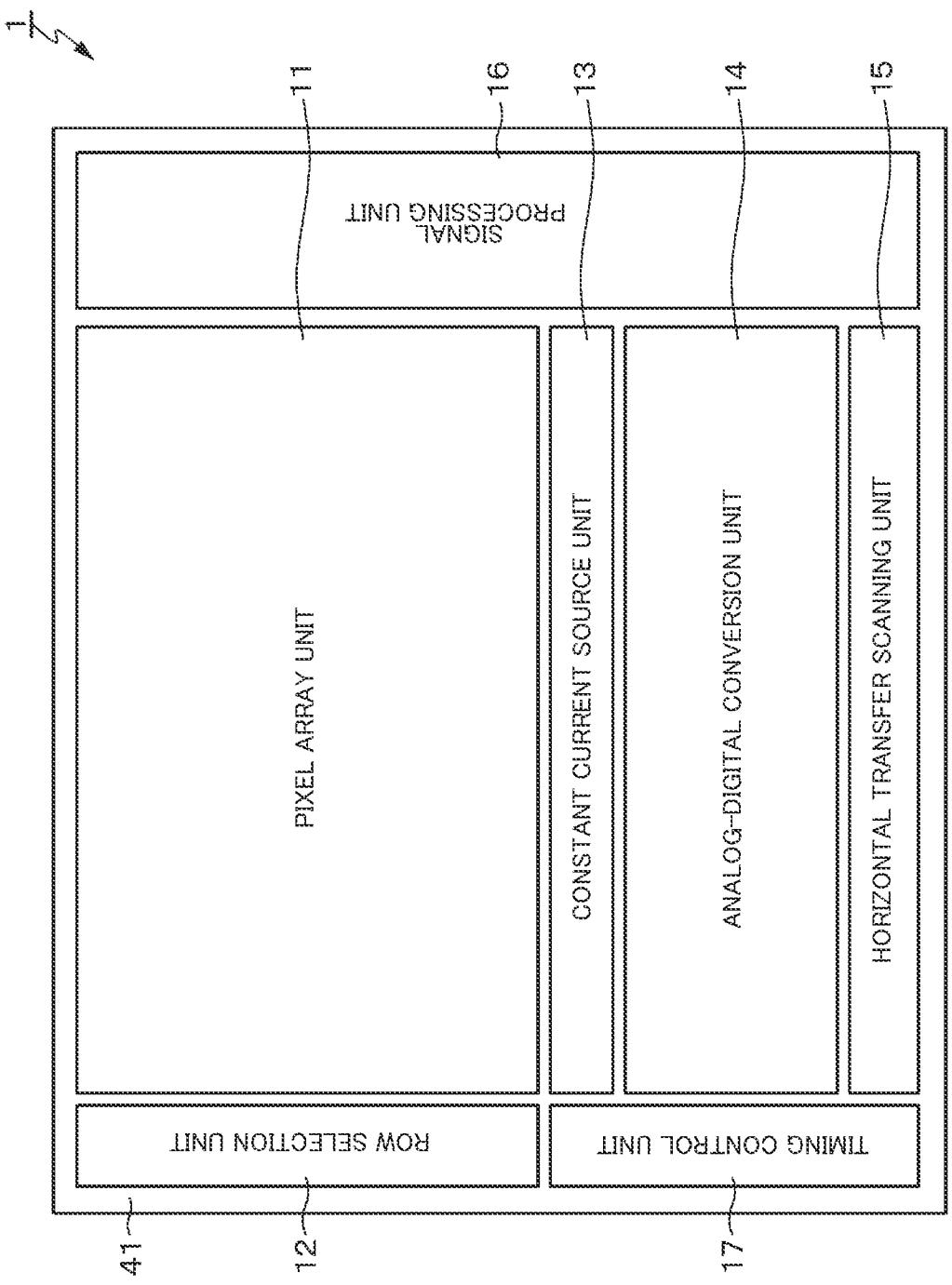
FIG. 4 is a plan view depicting an overview of a planar type chip structure.

FIG. 4 is a plan view depicting an overview of a planar type chip structure of the CMOS image sensor 1. As illustrated in FIG. 4, the planar type chip structure (planar structure) is a structure where the peripheral circuit portions of the pixel array unit 11 are formed on the same semiconductor substrate 41 where the pixel array unit 11, in which the pixels 2 are arrayed in a matrix, is formed. Specifically, on the same semiconductor substrate 41 of the pixel array unit 11, the row selection unit 12, the constant current source unit 13, the analog-digital conversion unit 14, the horizontal transfer scanning unit 15, the signal processing unit 16, the timing control unit 17, and the like, are formed.

Stack Type Chip Structure

Figure 5:
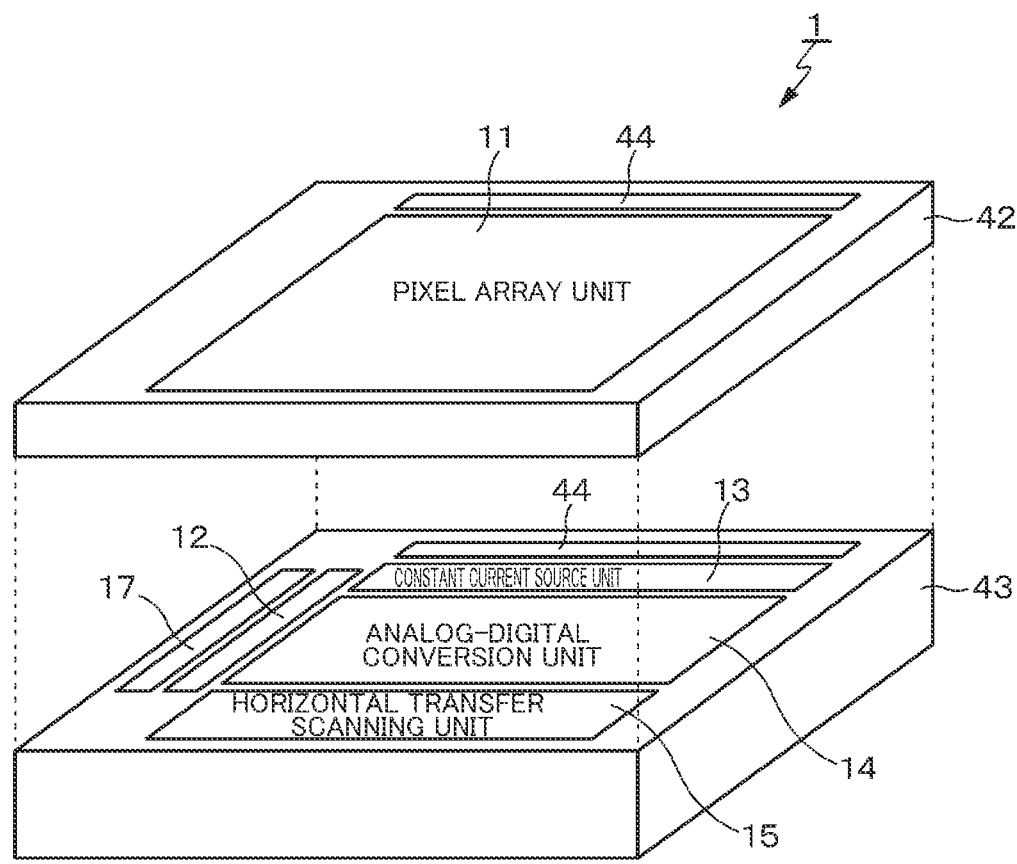
FIG. 5 is an exploded perspective view depicting an overview of a stack type chip structure.

FIG. 5 is an exploded perspective view depicting an overview of the stack type chip structure of the CMOS image sensor 1. As illustrated in FIG. 5, the stack type chip structure (stack structure) is a structure where at least two semiconductor substrates, that is, a first semiconductor substrate 42 and a second semiconductor substrate (logic chip) 43 are stacked. The first semiconductor substrate 42 is a pixel chip, and the second semiconductor substrate 43 is a logic chip.

In this stack structure, the pixel array unit 11 is formed on the first semiconductor substrate 42, which is the first layer. The circuit portions, such as the row selection unit 12, the constant current source unit 13, the analog-digital conversion unit 14, the horizontal transfer scanning unit 15, the signal processing unit 16 and the timing control unit 17, are formed on the second semiconductor substrate 43, which is the second layer. The first semiconductor substrate 42 on the first layer and the second semiconductor substrate 43 on the second layer are electrically connected via a connection unit 44, such as bumps, vias, Cu—Cu connection, or the like.

According to the CMOS image sensor 1 having this stack structure, the size (area) of the first semiconductor substrate 42 is sufficient only if the pixel array unit 11 can be formed, hence the size (area) of the first semiconductor substrate 42 on the first layer and the size of the entire chip as well can be decreased. Further, a process appropriate for fabricating the pixels 2 can be used for the first semiconductor substrate 42 on the first layer, and a process appropriate for fabricating the circuit portions can be used for the second semiconductor substrate 43 on the second layer, hence the process of manufacturing the CMOS image sensor 1 can be optimized. Particularly the latest process can be used for fabricating the circuit portions.

Here the stack structure constituted of two layers, where the first semiconductor substrate 42 and the second semiconductor substrate 43 are stacked, was described as an example, but the stack structure is not limited to the two-layer structure, and a structure constituted of three or more layers may be used. In the case of a stack structure constituted of three or more layers, the circuit portions, such as the row selection unit 12, the constant current source unit 13, the analog-digital conversion unit 14, the horizontal transfer scanning unit 15, the signal processing unit 16 and the timing control unit 17, may be distributed on the second and later layers.

[Addition Readout of Pixel Signals]

An electronic device, such as a camera, equipped with the imaging apparatus represented by the above mentioned CMOS image sensor 1, is demanded to support both the still image mode and the moving image mode. In the still image mode, all the pixels are readout. In the moving image mode, thinning readout, addition readout and the like are performed for pixel signals, but in terms of spatial resolution and contrast sensitivity, the addition readout is more desirable than the thinning readout.

The addition readout method is, for example, a logic addition method which performs addition in the subsequent stage of the analog-digital conversion unit 14, an analog-digital (AD) addition method which performs addition using the analog-digital conversion unit 14, a source follower (SF) addition method which performs addition on the vertical signal line 32, and a floating diffusion (FD) addition method for performing addition among floating diffusions FD of the pixels 2.

Now an overview of each addition readout method based on the logic addition method, the AD addition method, the SF addition method, and the FD addition method will be described. Here, a pixel addition in a case of adding pixel signals of pixel 1 and pixel 2, which are vertically adjacent to each other in the first pixel column, are added will be described as an example.

Figure 6:
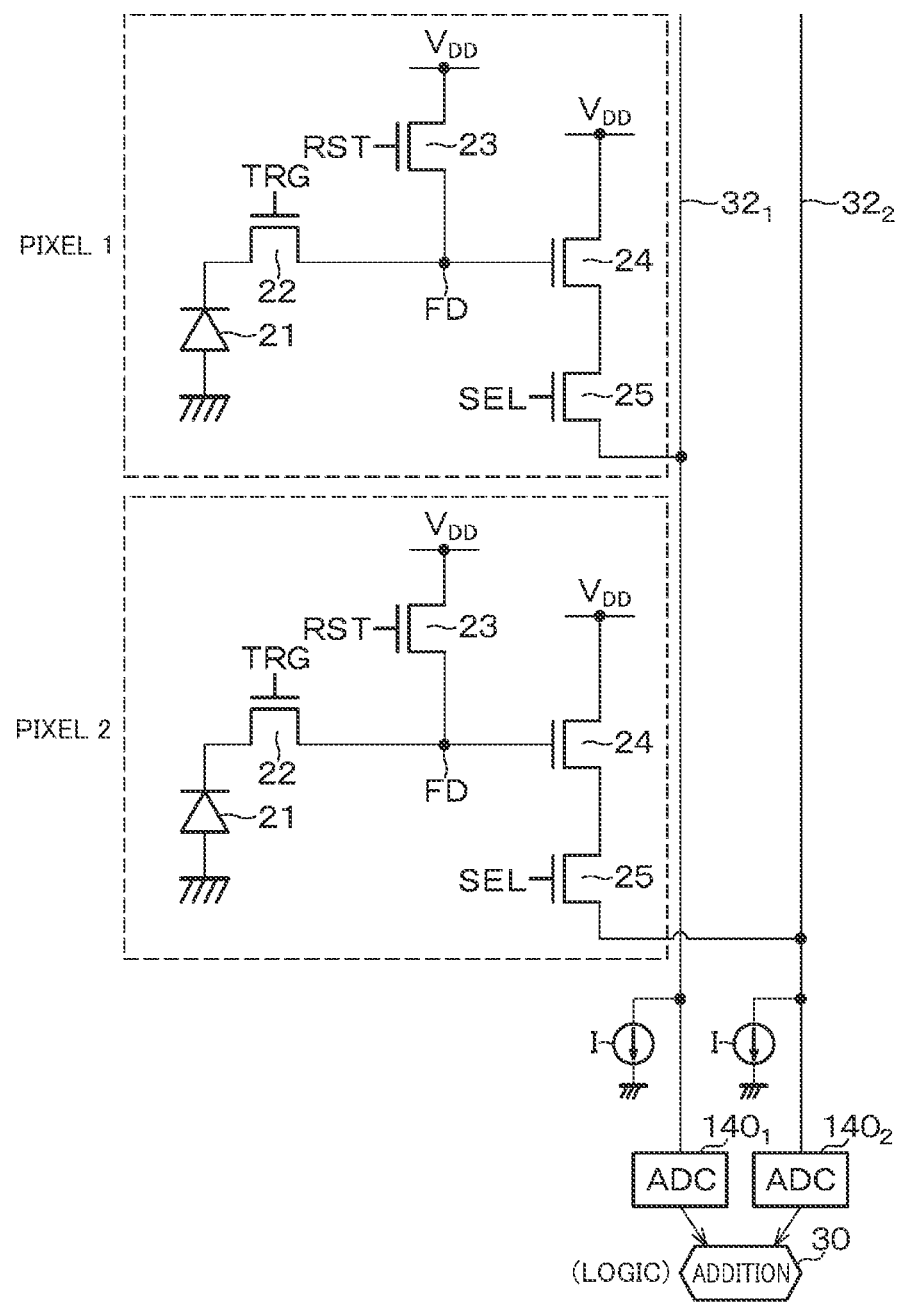
FIG. 6 is an explanatory diagram on an overview of an addition readout of a logic addition method.

Logic addition method FIG. 6 is an explanatory diagram on an overview of the addition readout of the logic addition method. The respective output ends of the vertical signal lines $32_1$ and $32_2$ are connected to the respective input ends of the analog-digital convertors (ADC) $140_1$ and $140_2$.

A pixel signal of the pixel 1 is supplied to the analog-digital convertor $140_1$ via the vertical signal line $32_1$, and is converted into a digital signal. A pixel signal of the pixel 2 is supplied to the analog-digital convertor $140_2$ via the vertical signal line $32_2$, and is converted into a digital signal. Then in the logic circuit 30 in the subsequent stage of the analog-digital convertors $140_1$ and $140_2$, the respective pixel signals of the pixel 1 and pixel 2, converted into digital signals by the analog-digital convertors $140_1$ and $140_2$, are added.

AD Addition Method

Figure 7:
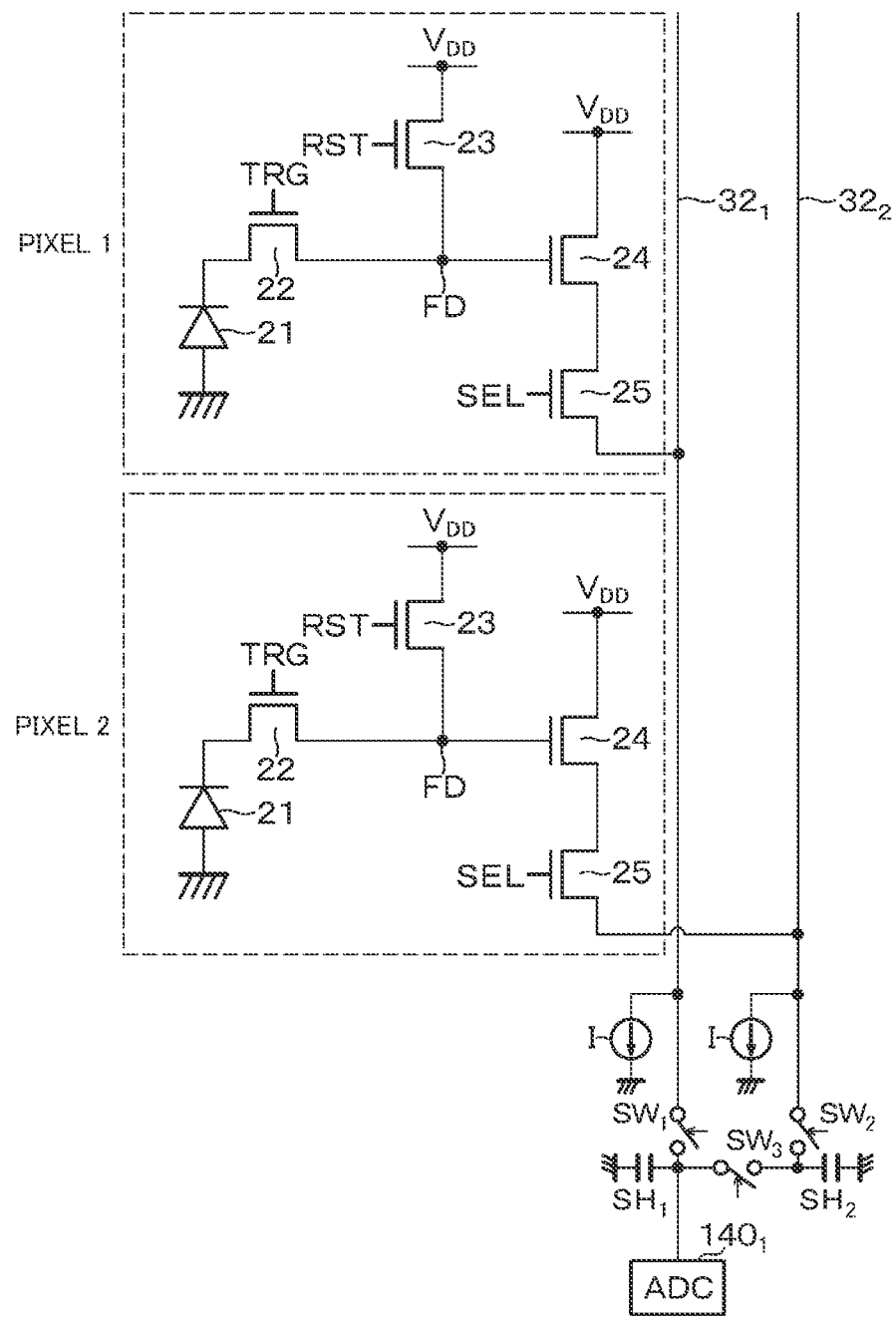
FIG. 7 is an explanatory diagram on an overview of an addition readout of an analog-digital (AD) addition method.

FIG. 7 is an explanatory diagram on an overview of the addition readout of the AD addition method. The respective output ends of the vertical signal lines $32_1$ and $32_2$ are connected to the respective one ends of the switches $SW_1$ and $SW_2$. Sample hold capacitors $SH_1$ and $SH_2$ are connected between the respective ends of the switches $SW_1$ and $SW_2$ and the ground. A switch $SW_3$ is connected between the respective other ends of the switches $SW_1$ and $SW_2$.

The respective pixel signal of the pixels 1 and 2, which are readout via the vertical signal lines $32_1$ and $32_2$ are sampled and held by the sample hold capacitors $SH_1$ and $SH_2$, and are then supplied to the analog-digital convertor $140_1$ and added by the analog-digital convertor $140_1$, so as to perform the analog-digital conversion processing.

SF Addition Method

Figure 8:
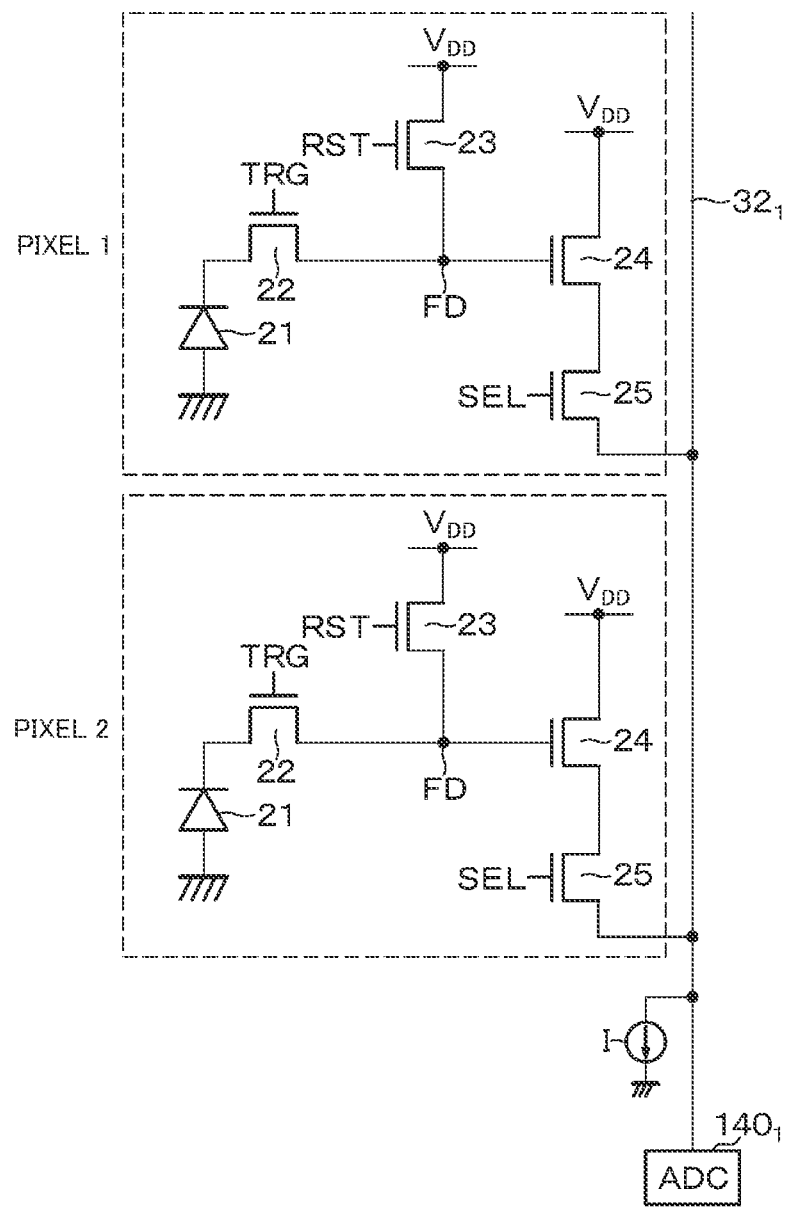
FIG. 8 is an explanatory diagram on an overview of an addition readout of a source-follower (SF) addition method.

FIG. 8 is an explanatory diagram on an overview of the addition readout of the SF addition method. As described above, the amplification transistor 24 of each pixel and the current source I connected to one end of the vertical signal line 32 ($32_1$~$32_n$) form a source follower. The respective pixel signals of the pixels 1 and 2 are both readout by a common vertical signal line $32_1$ and added in this source follower.

FD Addition Method

Figure 9:
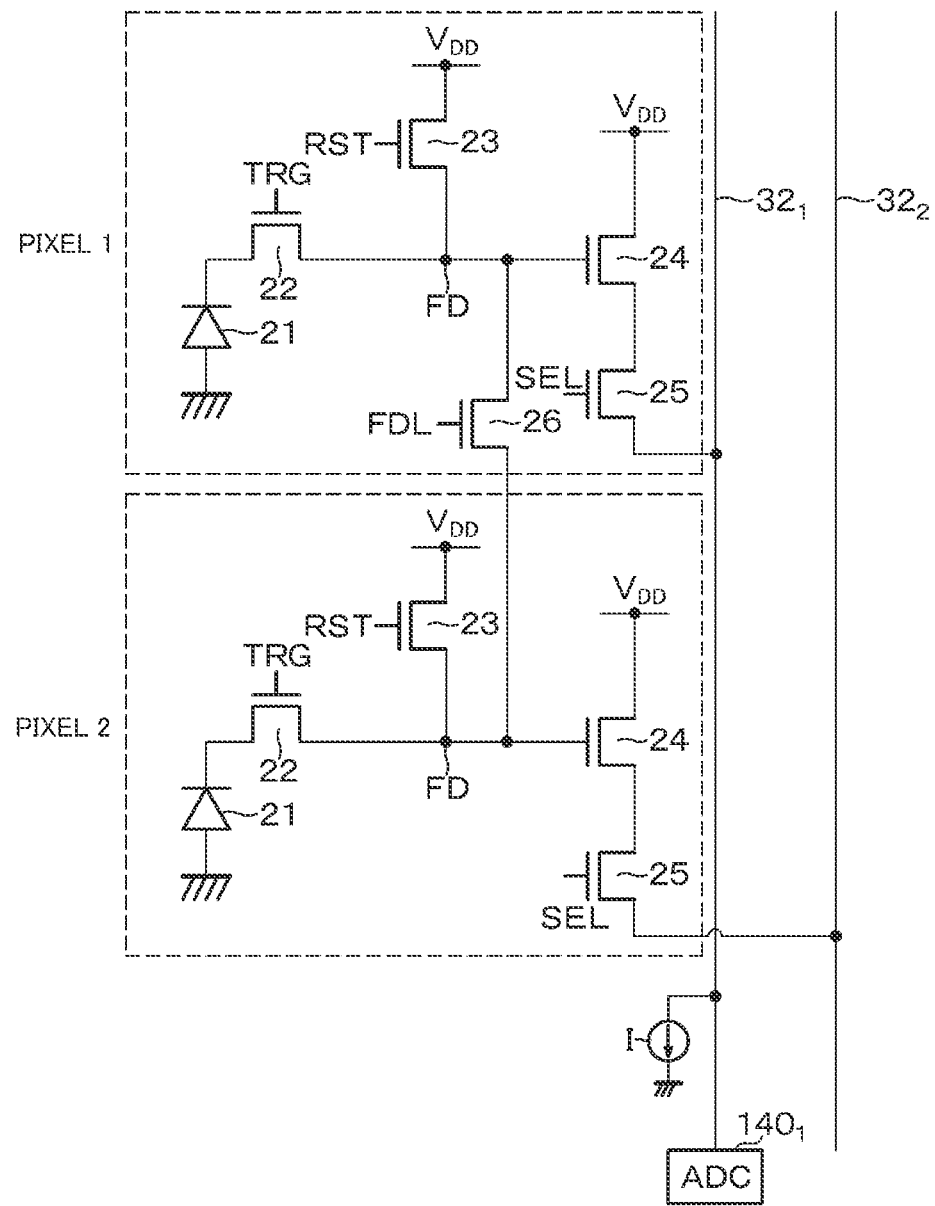
FIG. 9 is an explanatory diagram on an overview of an addition readout of a floating diffusion (FD) addition method.

FIG. 9 is an explanatory diagram on an overview of the addition readout of the FD addition method. Between the respective floating diffusions FD of the pixels 1 and 2, a switch transistor 26, which selectively connects these FD nodes, is connected. When the switch transistor 26 becomes the conduction state, the respective pixel signals of the pixels 1 and 2 are added between the respective floating diffusions FD of the pixels 1 and 2.

Figure 10:
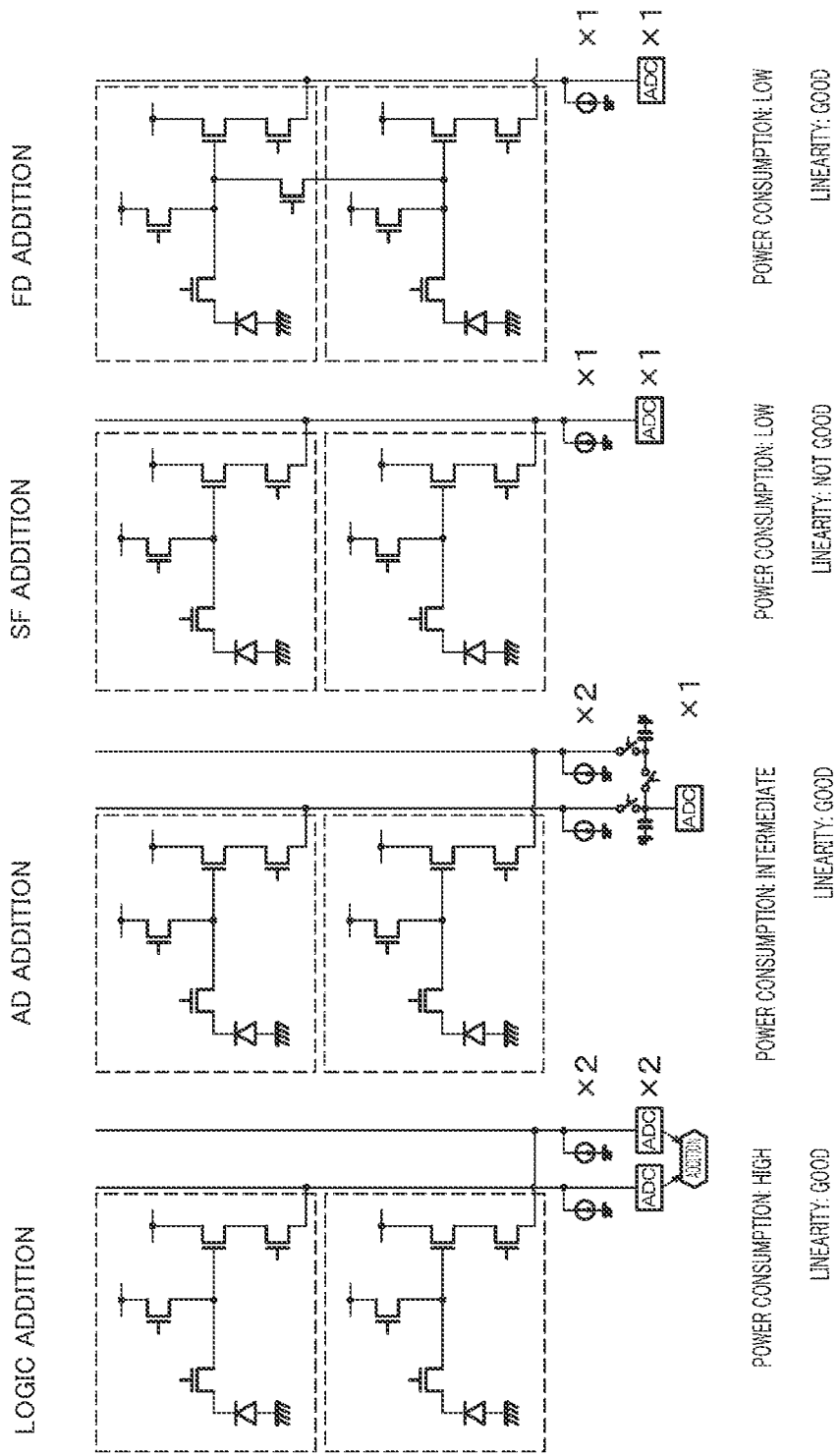
FIG. 10 is an explanatory diagram for comparing the logic addition method, AD addition method, SF addition method and FD addition method in terms of power consumption and linearity of the signal after addition.

Here, the respective power consumption of the logic addition method, the AD addition method, the SF addition method and the FD addition method, and the linearity of the post addition signals thereof will be described with reference to FIG. 10. The numeric values used in FIG. 10 are relative values of the current consumption of the current source I, which is connected to one end of the vertical signal line 32, and the current consumption of the analog-digital convertor 140.

In the case of the logic addition method and the AD addition method, the respective pixel signals of the pixels 1 and 2 are read out via the two vertical signal lines $32_1$ and $32_2$, and furthermore, in the case of the logic addition method, the addition processing is performed using two analog-digital convertors $140_1$ and $140_2$. Therefore power consumption of the SF addition method and the FD addition method, in which the respective pixel signals of the pixels 1 and 2 are read using one vertical signal lines $32_1$, is lower than the logic addition method and the AD addition method.

The SF addition method has a problem in terms of linearity of the post addition signal. This problem with linearity of the SF addition method will be described with reference to FIG. 11.

When the potential difference between the pixel signals $V_1$ and $V_2$, which are inputted to the amplification transistors 24 of the two pixels, is small (region a), the post addition signal $V_0$ can follow the mean value of the pixel signals $V_1$ and $V_2$. However, when the potential difference between the pixel signals $V_1$ and $V_2$ increases (region b), the post addition signal $V_0$ is clipped to a higher potential side of the pixel signals $V_1$ and $V_2$, and cannot follow the mean value of the pixel signals $V_1$ and $V_2$ in an ideal manner.

In the case of the FD addition method, the linearity problem of the SF addition method does not occur. Therefore, in terms of the power consumption and the linearity of the post addition signal, the FD addition method is the best addition readout method among the logic addition method, the AD addition method, the SF addition method and the FD addition method.

Figure 12:
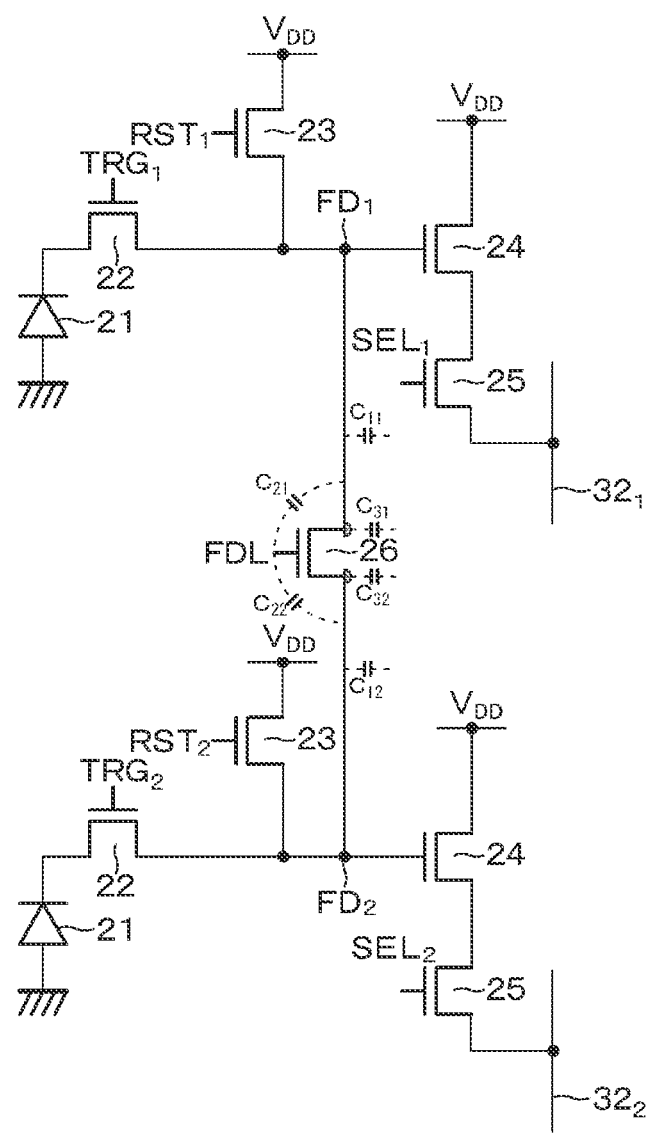
FIG. 12 is an explanatory diagram for describing deterioration of a circuit noise electron count of input conversion of the FD addition method.

However, as illustrated in FIG. 12, if the lines $L_1$ and $L_2$, which selectively connect the FD nodes ($FD_1$-$FD_2$) of the two pixels and the switch transistor 26 are simply disposed to implement the FD addition, unnecessary parasitic capacitance is added to the FD nodes. The unnecessary parasitic capacitance added to the FD nodes is, for example, parasitic capacitance $c_{11}$ and $c_{12}$ of the lines $L_1$ and $L_2$, coupling capacitance $c_{21}$ and $c_{22}$ between the gate electrode of the switch transistor 26 and the drain/source region, and diffusion capacitance $c_{31}$ and $c_{32}$ of the drain/source region.

In the case of the FD addition method, if unnecessary parasitic capacitance is added to the FD node, the conversion efficiency in the still image mode, in which the switch transistor 26 is in the non-conduction state and the pixel addition is not performed, drops, and the circuit noise electron count of input conversion decreases compared with the case where the switch transistor 26 is the conduction state and the pixel addition is performed. "Conversion efficiency" here refers to the efficiency when the charges are converted into voltage in the floating diffusion FD. The conversion efficiency is determined by the capacitance (including parasitic capacitance) of the floating diffusion FD.

In the case of the prior art according to PTL1, the FD nodes of the two pixels are selectively connected via switch to change the conversion efficiency, and when this switch is in the non-conduction state, the parasitic capacitance of the lines to short-circuit the FD nodes of the two pixels is not added to the FD node as unnecessary capacitance. Therefore according to this prior art, the conversion efficiency does not drop in the still image node, but the pixel addition by the FD addition can be performed only in the low conversion efficiency state.

Embodiment of the Present Disclosure

In order to enable addition readout (pixel addition) by the FD addition even in a state other than the low conversion efficiency state, an embodiment of the present disclosure is configured so that the conversion efficiency can be switched in a plurality of steps in both the readout mode without pixel addition (still image mode) and the readout mode with pixel addition (moving image mode) based on the FD addition. Specifically, the conversion efficiency in the readout mode without pixel addition can be switched in three steps: low/intermediate/high. Thereby the noise characteristic/maximum charge quantity Qs can be more freely set to the optimum in accordance with the ISO sensitivity. Furthermore, in the readout mode with pixel addition, not only the low conversion efficiency but also the intermediate conversion efficiency can be implemented, hence the noise characteristic in the high ISO sensitivity setting can be improved. In this way, both the multi-step switching function of the conversion efficiency of the floating diffusion FD and the FD addition function between the pixels can be implemented.

Now specific examples of the present embodiment, which enable addition readout (pixel addition) by the FD addition even in a state other than the low conversion efficiency state, will be described.

First Embodiment

Figure 13:
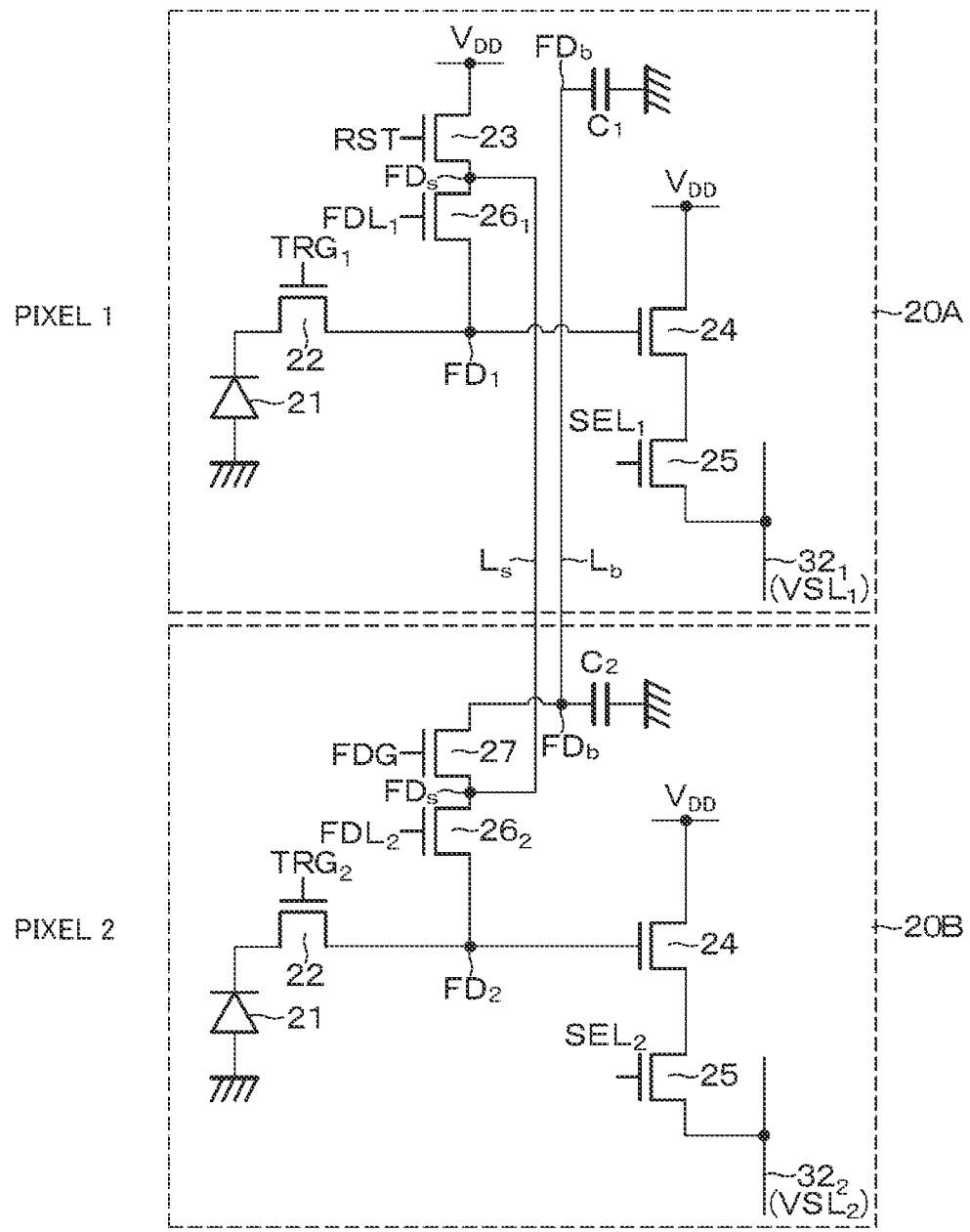
FIG. 13 is a circuit diagram depicting a circuit configuration of a pixel circuit according to a first embodiment.

A first embodiment is a case of a basic form of the pixel circuit according to the embodiment to perform the pixel addition by the FD addition, and each of the first and second pixel units is constituted of a single pixel. FIG. 13 indicates a circuit configuration of a pixel circuit according to the first embodiment. Here a case where the pixel addition is selectively performed between a first pixel unit 20A and a second pixel unit 20B, which are vertically adjacent to each other in a certain pixel column, will be described as an example. In the first embodiment, the first pixel unit 20A is constituted of a single pixel 1, and the second pixel unit 20B is constituted of a single pixel 2.

Each of the pixel 1 and the pixel 2 includes the photodiode 21, which is an example of the light-receiving portion, the transfer transistor 22, the floating diffusion FD (FD$_1$/FD$_2$), the amplification transistor 24, and the selection transistor 25.

In addition to the above mentioned circuit elements, the pixel 1 includes a first switch transistor 26$_1$, the reset transistor 23 and a capacitive element C$_1$. One source/drain electrode of the first switch transistor 26$_1$ is connected to the floating diffusion FD$_1$. The reset transistor 23 is connected between another source/drain electrode of the first switch transistor 26$_1$ and a power supply node of the power supply voltage V$_{DD}$. Here a common connection node of the other source/drain electrode of the first switch transistor 26$_1$ and one source/drain electrode of the reset transistor 23 is assumed to be the node FD$_s$.

In addition to the above mentioned circuit elements, the pixel 2 includes a second switch transistor 26$_2$, a third switch transistor 27, and a capacitive element C$_2$. One source/drain electrode of the second switch transistor 26$_2$ is connected to the floating diffusion FD$_2$. One source/drain electrode of the third switch transistor 27 is connected to another source/drain electrode of the second switch transistor 26$_2$. Here a common connection node of the other source/drain electrode of the second switch transistor 26$_2$ and the one source/drain electrode of the third switch transistor 27 is assumed to be the node FD$_s$.

The capacitive elements C$_1$ and C$_2$ are disposed in the pixel 1 and the pixel 2 respectively. Specifically, one end of the capacitive element C$_1$ disposed in the pixel 1 is connected to the other source/drain electrode of the third switch transistor 27 via a line L$_b$, and the other end thereof is connected to a GND node, which is a reference potential node. A common connection node of the one end of the capacitive element C$_1$ and the line L$_b$ is assumed to be the node FD$_b$. A first end of the capacitive element C$_2$ disposed in the pixel 2 is connected to the other source/drain electrode of the third switch transistor 27, and the other end thereof is connected to a GND node. A common connection node of the one end of the capacitive element C$_2$ and the other source/drain electrode of the third switch transistor 27 is assumed to be the node FD$_b$.

In the pixel 1 and the pixel 2, the respective nodes FD$_s$ (connection nodes) of the other source/drain electrode of the second switch transistor 26$_1$ and the other source/drain electrode of the second switch transistor 26$_2$ are electrically connected via the line L$_s$. The respective nodes FD$_b$ (connection nodes) of the one end of the capacitive element C$_1$ and the first end of the capacitive element C$_2$ are electrically connected via the line L$_b$.

In the pixel circuit according to the first embodiment having the above mentioned configuration, the conversion efficiency in the readout mode without pixel addition (still image mode) can be switched in three steps: low/intermediate/high.

Specifically, in the pixel 1/pixel 2, the first switch transistor 26$_1$/second transistor 26$_2$ become a non-conduction state when the pixel signals are readout. In this case, each conversion efficiency of the floating diffusions FD$_1$ and FD$_2$ is determined by each capacitance of the FD$_1$ node and the FD$_2$ node, and high conversion efficiency is implemented.

Further, in the pixel 1/pixel 2, the first switch transistor 26$_1$/second switch transistor 26$_2$ both become the conduction state when the pixel signals are readout. In this case, each gate capacitance of the first and second switch transistors 26$_1$ and 26$_2$ and the parasitic capacitance of the line L$_s$, which connects the respective nodes FD$_s$ of the pixels 1 and 2, are added to each capacitance of the FD$_1$ node and the FD$_2$ node. As a result, each conversion efficiency of the floating diffusions FD$_1$ and FD$_2$ becomes intermediate conversion efficiency.

Furthermore, in pixel 1/pixel 2, the first switch transistor 26$_1$/second switch transistor 26$_2$/the third switch transistor 27 all become the conduction state when the pixel signals are readout. In this case, each capacitance of the capacitive elements C$_1$ and C$_2$ and the parasitic capacitance of the line L$_b$, which connects the nodes FD$_b$, are added to each capacitance of the FD$_1$ node and the FD$_2$ node, in addition to each gate capacitance of the first and second switch transistors 26$_1$ and 26$_2$ and the parasitic capacitance of the line L$_s$. As a result, each conversion efficiency of the floating diffusions FD$_1$ and FD$_2$ becomes low conversion efficiency.

On the other hand, the conversion efficiency of the readout mode with pixel addition (moving image mode) can be switched in two steps: low/intermediate.

Specifically, when the addition readout is performed, the first switch transistor 26$_1$ and the second switch transistor 26$_2$ both become the conduction state, and in this case, the conversion efficiency is determined by each capacitance of the FD$_1$ node and the FD$_2$ node, each gate capacitance of the first and second switch transistors 26$_1$ and 26$_2$ and the parasitic capacitance of the line L$_s$, and the conversion efficiency becomes intermediate conversion efficiency.

Further, when the addition readout is performed, the first switch transistor 26$_1$, the second switch transistor 26$_2$ and the third switch transistor 27 all become the conduction state, and in this case, the conversion efficiency is determined by each capacitance of the FD$_1$ node and the FD$_2$ node, each gate capacitance of the first and second switch transistors 26$_1$ and 26$_2$, the parasitic capacitance of the line $L_s$ and the parasitic capacitance of the line $L_b$, and the conversion efficiency becomes the low conversion efficiency.

Next the circuit operation of the still image mode without pixel addition and the circuit operation in the moving image mode with pixel addition in the pixel circuit according to the first embodiment will be described.

(Still Image Mode without Pixel Addition)

(1) In the Case of High Conversion Efficiency

FIG. 14 indicates timing charts for describing operation in the case of high conversion efficiency in the still image mode without pixel addition. In the timing charts in FIG. 14, a timing relationship of a horizontal synchronization signal XHS, a reset signal RST, a first switch signal $FDL_1$, a second switch signal $FDL_2$, a third switch signal FDG and transfer signals $TRG_1$ and $TRG_2$ is indicated. This is the same for each timing chart to be described later.

Readout of Pixel 1

In the case of readout of the pixel signal of the pixel 1, when the reset signal RST and the first switch signal $FDL_1$ change from the low level to the high level at time $t_{11}$, the reset transistor 23 and the first switch transistor $26_1$ become the conduction state. Thereby the floating diffusion $FD_1$ of the pixel 1 is reset. In this case, the level of the second switch signal $FDL_2$ is not considered.

Then after the first switch signal $FDL_1$ changes from the high level to the low level at time $t_{12}$, the transfer signal $TRG_1$ changes from the low level to the high level at time $t_{13}$, whereby the transfer transistor 22 of the pixel 1 becomes the conduction state, and the pixel signal of the pixel 1 is read out in the pixel 1. Then after the transfer signal $TRG_1$ changes from the high level to the low level at time $t_{14}$, the reset signal RST changes from the high level to the low level at time $t_{15}$.

Readout of Pixel 2

In the case of readout of the pixel signal of the pixel 2, when the reset signal RST and the second switch signal $FDL_2$ change from the low level of the high level at time $t_{11}$, the reset transistor 23 and the second switch transistor $26_2$ become the conduction state. Thereby the floating diffusion $FD_2$ in the pixel 2 is reset. In this case, the level of the first switch signal $FDL_1$ is not considered.

Then after the second switch signal $FDL_2$ changes from the high level to the low level at time $t_{12}$, the transfer signal $TRG_2$ changes from the low level to the high level at time $t_{13}$, whereby the transfer transistor 22 of the pixel 2 becomes the conduction state, and the pixel signal of the pixel 2 is read out. Then after the transfer signal $TRG_2$ changes from the high level to the low level at time $t_{14}$, the reset signal RST changes from the high level to the low level at time $t_{15}$.

(2) In the Case of Intermediate Conversion Efficiency

FIG. 15 indicates timing charts for describing operation in the case of intermediate conversion efficiency in the still image mode without pixel addition.

Readout of Pixel 1

In the case of readout of the pixel signal of the pixel 1, when the reset signal RST, the first switch signal $FDL_1$ and the second switch signal $FDL_2$ change from the low level to the high level at time $t_{21}$, the reset transistor 23, the first switch transistor $26_1$ and the second switch transistor $26_2$ become the conduction state. Thereby the floating diffusion $FD_1$ of the pixel 1 and the floating diffusion $FD_2$ of the pixel 2 are reset.

Then after the reset signal RST changes from the high level to the low level at time $t_{22}$, the transfer signal $TRG_1$ changes from the low level to the high level at time $t_{23}$, whereby the transfer transistor 22 of the pixel 1 becomes the conduction state, and the pixel signal of the pixel 1 is read out. Then after the transfer signal $TRG_1$ changes from the high level to the low level at time $t_{24}$, the first switch signal $FDL_1$ and the second switch signal $FDL_2$ change from the high level to the low level at time $t_{25}$.

Readout of Pixel 2

In the case of readout of the pixel signal of the pixel 2, when the reset signal RST, the first switch signal $FDL_1$ and the second switch signal $FDL_2$ change from the low level to the high level at time $t_{21}$, the reset transistor 23, the first switch transistor $26_1$ and the second switch transistor $26_2$ become the conduction state. Thereby the floating diffusion $FD_1$ of the pixel 1 and the floating diffusion $FD_2$ of the pixel 2 are reset.

Then after the reset signal RST changes from the high level to the low level at time $t_{22}$, the transfer signal $TRG_2$ changes from the low level to the high level at time $t_{23}$, whereby the transfer transistor 22 of the pixel 2 becomes the conduction state, and the pixel signal of the pixel 2 is read out. Then after the transfer signal $TRG_2$ changes from the high level to the low level at time $t_{24}$, the first switch signal $FDL_1$ and the second switch signal $FDL_2$ change from the high level to the low level at time $t_{25}$.

(3) In the Case of Low Conversion Efficiency

FIG. 16 indicates timing charts for describing operation in the case of low conversion efficiency in the still image mode without pixel addition.

Readout of Pixel 1

In the case of readout of the pixel signal of the pixel 1, when the reset signal RST, the first switch signal $FDL_1$, the second switch signal $FDL_2$ and the third switch signal FDG change from the low level to the high level at time $t_{31}$, the reset transistor 23, the first switch transistor $26_1$, the second switch transistor $26_2$ and the third switch transistor 27 become the conduction state. Thereby the floating diffusion $FD_1$ of the pixel 1 and the floating diffusion $FD_2$ of the pixel 2 are reset, and the capacitive elements $C_1$ and $C_2$ are connected to the node $FD_s$.

Then after the reset signal RST changes from the high level to the low level at time $t_{32}$, the transfer signal $TRG_1$ changes from the low level to the high level at time $t_{33}$, whereby the transfer transistor 22 of the pixel 1 becomes the conduction state, and the pixel signal of the pixel 1 is read out. Then after the transfer signal $TRG_1$ changes from the high level to the low level at time $t_{34}$, the first switch signal $FDL_1$, the second switch signal $FDL_2$ and the third switch signal FDG change from the high level to the low level at time $t_{35}$.

Readout of Pixel 2

In the case of readout of the pixel signal of the pixel 2, when the reset signal RST, the first switch signal $FDL_1$, the second switch signal $FDL_2$ and the third switch signal FDG change from the low level to the high level at time $t_{31}$, the reset transistor 23, the first switch transistor $26_1$, the second switch transistor $26_2$ and the third switch transistor 27 become the conduction state. Thereby the floating diffusion $FD_1$ of the pixel 1 and the floating diffusion $FD_2$ of the pixel 2 are reset, and the capacitive elements $C_1$ and $C_2$ are connected to the node $FD_s$.

Then after the reset signal RST changes from the high level to the low level at time $t_{32}$, the transfer signal $TRG_2$ changes from the low level to the high level at time $t_{33}$, whereby the transfer transistor 22 of the pixel 2 becomes the conduction state, and the pixel signal of the pixel 2 is read out. Then after the transfer signal $TRG_2$ changes from the high level to the low level at time $t_{34}$, the first switch signal $FDL_1$, the second switch signal $FDL_2$ and the third switch signal FDG change from the high level to the low level at time $t_{35}$.

(Moving Image Mode with Pixel Addition)

Circuit operation in the moving image mode with pixel addition will be described next. In the moving image mode with pixel addition, addition readout at intermediate conversion efficiency and addition readout at low conversion efficiency are performed.

Addition Readout at Intermediate Conversion Efficiency

FIG. 17A indicates a timing chart for describing operation in the case of addition readout at intermediate conversion efficiency.

When the reset signal RST, the first switch signal $FDL_1$ and the second switch signal $FDL_2$ change from the low level to the high level at time $t_{41}$, the reset transistor 23, the first switch transistor $26_1$ and the second switch transistor $26_2$ become the conduction state. Thereby the floating diffusion $FD_1$ of the pixel 1 and the floating diffusion $FD_2$ of the pixel 2 are reset.

Then after the reset signal RST changes from the high level to the low level at time $t_{42}$, the transfer signal $TRG_1$ of the pixel 1 and the transfer signal $TRG_2$ of the pixel 2 both change from the low level to the high level at time $t_{43}$, whereby the transfer transistors 22 of the pixel 1 and pixel 2 both become the conduction state. Thereby the addition readout of the pixel signal is performed between the pixel 1 and the pixel 2. Then after the transfer signals $TRG_1$ and $TRG_2$ change from the high level to the low level at time $t_{44}$, the first switch signal $FDL_1$ and the second switch signal $FDL_2$ change from the high level to the low level at time $t_{45}$.

Addition Readout at Low Conversion Efficiency

FIG. 17B indicates a timing chart for describing operation in the case of addition readout at low conversion efficiency.

When the reset signal RST, the first switch signal $FDL_1$, the second switch signal $FDL_2$ and the third switch signal FDG change from the low level to the high level at time $t_{41}$, the reset transistor 23, the first switch transistor $26_1$, the second switch transistor $26_2$ and the third switch transistor 27 become the conduction state. Thereby the floating diffusion $FD_1$ of the pixel 1 and the floating diffusion $FD_2$ of the pixel 2 are reset, and the capacitive elements $C_1$ and $C_2$ are connected to the nodes $FD_s$.

Then after the reset signal RST changes from the high level to the low level at time $t_{42}$, the transfer signal $TRG_1$ of the pixel 1 and the transfer signal $TRG_2$ of the pixel 2 both change from the low level to the high level at time $t_{43}$, whereby the transfer transistors 22 of the pixel 1 and the pixel 2 both become the conduction state. Thereby the addition readout of the pixel signals is performed between the pixel 1 and the pixel 2. Then after the transfer signals $TRG_1$ and $TRG_2$ change from the high level to the low level at time $t_{44}$, the first switch signal $FDL_1$, the second switch signal $FDL_2$ and the third switch signal FDG change from the high level to the low level at time $t_{45}$.

(Layout of Pixel Circuit)

Figure 18:
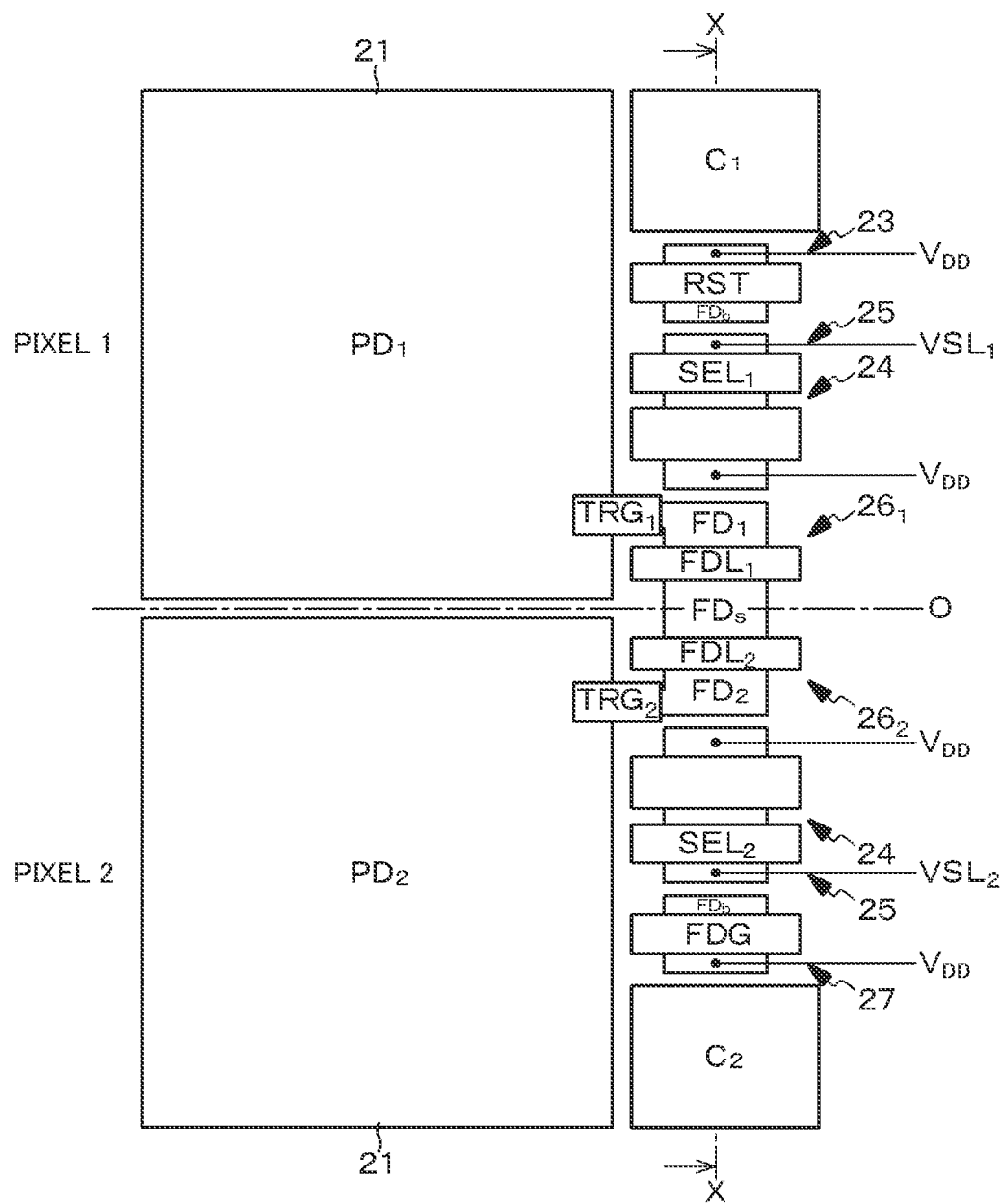
FIG. 18 is a plan view depicting a layout of the pixel circuit according to the first embodiment.
Figure 19:
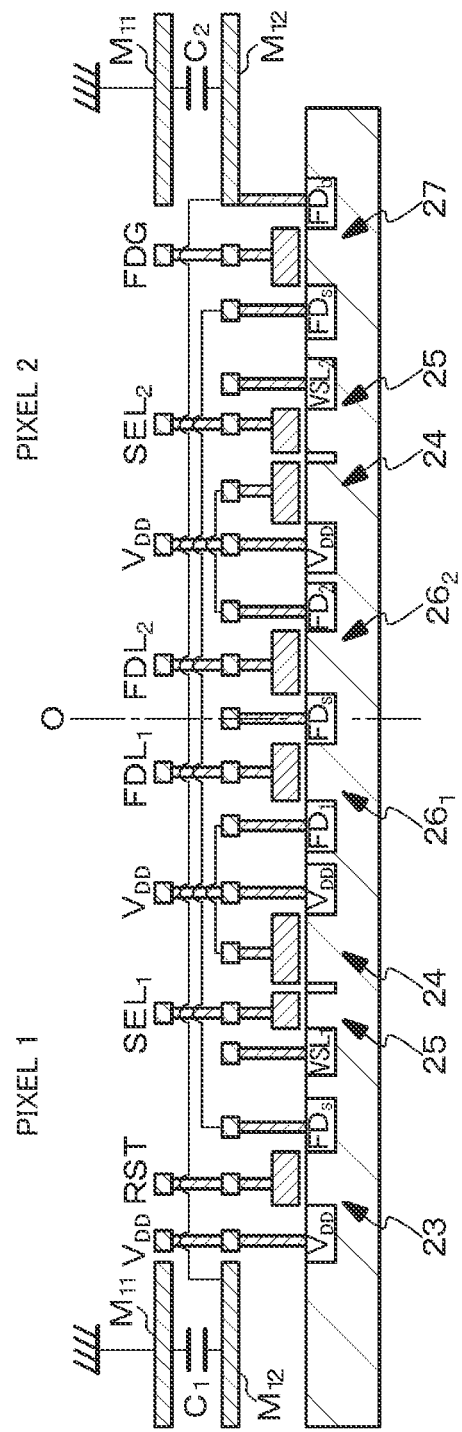
FIG. 19 is a cross-sectional view viewing in the arrow direction along the X-X line in FIG. 18.

FIG. 18 is a layout diagram (plan view) of the pixel circuits according to the first embodiment, and FIG. 19 is a cross-sectional view viewing in the arrow direction along the X-X line in FIG. 18. In FIG. 18, a gate electrode of each transistor is shaded by hatched lines to make understanding easier.

Composing elements of the pixel 1, which is the first pixel unit 20A, and composing elements of the pixel 2, which is the second pixel unit 20B, have a pixel layout ensuring symmetry with respect to the center line O between the pixel 1 and the pixel 2. Specifically, concerning the composing elements of the pixel 1, the first switch transistor $26_1$, the floating diffusion $FD_1$, the amplification transistor 24, the selection transistor 25 and the reset transistor 23 are disposed in this order from the center line O side. Concerning the composing elements of the pixel 2, the second switch transistor $26_2$, the floating diffusion $FD_1$, the amplification transistor 24, the selection transistor 25 and the third switch transistor 27 are disposed in this order from the center line O side.

In the above mentioned layout of the pixel 1 and the pixel 2, the floating diffusion $FD_1$ and the floating diffusion $FD_2$ are disposed at the center line O side of the center portions of the pixel 1 and the pixel 2 respectively. Thereby the floating diffusion $FD_1$ and the floating diffusion $FD_2$ are disposed in proximity to each other. According to this positional relationship, the line $L_s$ of each node $FD_b$ of the pixel 1 and the pixel 2 can be short, and the parasitic capacitance of the line $L_s$ can be decreased, whereby the intermediate conversion efficiency when the pixel addition is performed can be increased.

The capacitive element $C_1$ of the pixel 1 and the capacitive element $C_2$ of the pixel 2, which determine the low conversion efficiency, can be configured to be one capacitive element that is common to the pixel 1 and the pixel 2. However, it is preferable to dispose the capacitive elements divided into the pixel 1 and the pixel 2, in terms of symmetry of the pixel layout and ensuring uniformity of pixel characteristics.

As illustrated in FIG. 19, the capacitive element $C_1$ of the pixel 1 and the capacitive element $C_2$ of the pixel 2 can be implemented by coupling capacitance between the metal line $M_{11}$ and the metal line $M_{12}$ respectively. However, this implementation is not limited to the coupling capacitance between the metal lines $M_{11}$ and $M_{12}$, but capacitance elements using oxide film, for example, may be used.

The respective pixel structures of the first pixel unit 20A and the second pixel unit 20B may have a back-illuminated pixel structure which receives light emitted from a back surface side, which is the opposite side of the substrate surface on which a wiring layer is disposed (front surface), or may have a front-illuminated pixel structure which receives light emitted from the front surface side.

In the case of the front-illuminated pixel structure, it is critical to dispose the metal lines $M_{11}$ and $M_{12}$ constituting the capacitive element $C_1$ and the capacitive element $C_2$ respectively, so as to avoid protruding into the region of the photodiode 21 ($PD_1$ and $PD_2$). If each of the metal lines $M_{11}$ and $M_{12}$ protrudes into the region of the photodiode 21, the opening area of the photodiode 21 decreases.

In the case of the back-illuminated pixel structure, on the other hand, no such restriction on the positions of the metal lines $M_{11}$ and $M_{12}$ is required as in the case of the front-illuminated pixel structure. Therefore in the case of the back-illuminated pixel structure, the metal lines $M_{11}$ and $M_{12}$, constituting the capacitive elements $C_1$ and $C_2$, can be disposed protruding into the region of the photodiodes 21, hence the capacitive elements $C_1$ and $C_2$ having larger capacitance values can be implemented.

Second Embodiment

Figure 20:
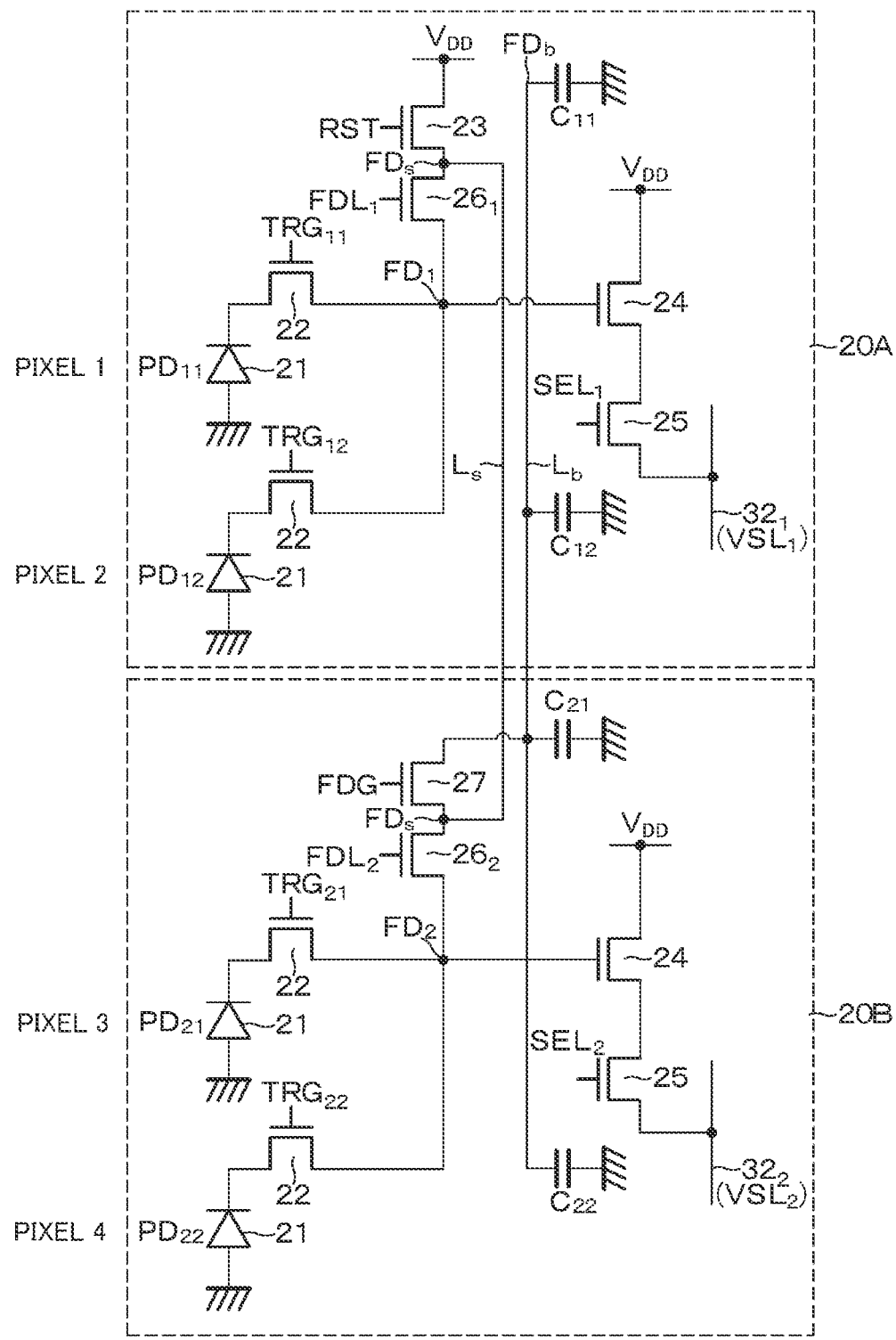
FIG. 20 is a circuit diagram depicting a circuit configuration of a pixel circuit according to a second embodiment.

A second embodiment is a case where each of the first and second pixel units is constituted of a plurality of pixels, and the plurality of pixels share a floating diffusion FD. FIG. 20 is a circuit configuration of a pixel circuit according to the second embodiment. Here a case where each of the first and second pixel units 20A and 20B is constituted of two pixels, and a floating diffusion FD is shared by the respective diodes (PD) 21 of the two pixels will be described as an example.

In the case of the pixel circuit according to the first embodiment where an FD is not shared, a dedicated set of the reset transistor 23/third switch transistor 27, the amplification transistor 24, the selection transistor 25 and the first switch transistor $26_1$/second switch transistor $26_2$ is assigned to each photodiode 21 ($PD_1/PD_2$). Therefore the opening area of the pixel becomes small.

In the pixel circuit according to the second embodiment where an FD is shared, on the other hand, the floating diffusion FD and circuit elements in the subsequent stages thereof are shared by the photodiodes of the two pixels ($PD_{11}$, $PD_{12}/PD_{21}$, $PD_2$), whereby the opening ratio of each pixel can be improved. The circuit elements in the subsequent stages of the floating diffusion FD are the reset transistor 23, the amplification transistor 24, the selection transistor 25 and the first switch transistor $26_1$ in the case of the first pixel unit 20A, and are the third switch transistor 27, the amplification transistor 24, the selection transistor 25 and the second switch transistor $26_2$ in the case of the second pixel unit 20B.

The technique of the pixel circuit according to the first embodiment may be applied to the pixel circuit according to the second embodiment where an FD is shared. Thereby, just like the case of the pixel circuit according to the first embodiment, the conversion efficiency in the readout mode without pixel addition (still image mode) can be switched in three steps: low/intermediate/high, and in the moving image mode with pixel addition, addition readout at intermediate conversion and addition readout at low conversion efficiency can be performed.

Here the pixel addition in the pixel circuit according to the second embodiment where an FD is shared will be described. In the Bayer pixel array (array of color filters) illustrated in FIG. 21, two pixels arranged vertically form a set in which the floating diffusion FD is shared (a set of pixels enclosed by the broken line in FIG. 21). Specifically, a floating diffusion FD is shared by a set of a red pixel R and a green pixel Gb, and a set of a green pixel Gr and a blue pixel B.

In the still image mode, charges which were photoelectrically converted by the photodiode (PD) 21 of each pixel in the set are read, but in the moving image mode, the pixel signals of the two pixels having a same color, which are vertically adjacent to each other, are added. Specifically, the pixel $R_1$ and the pixel $R_2$, the pixel $Gb_1$ and the pixel $Gb_2$, the pixel $Gr_1$ and the pixel $Gr_2$, and the pixel $B_1$ and the pixel $B_2$ are added respectively.

Figure 21:
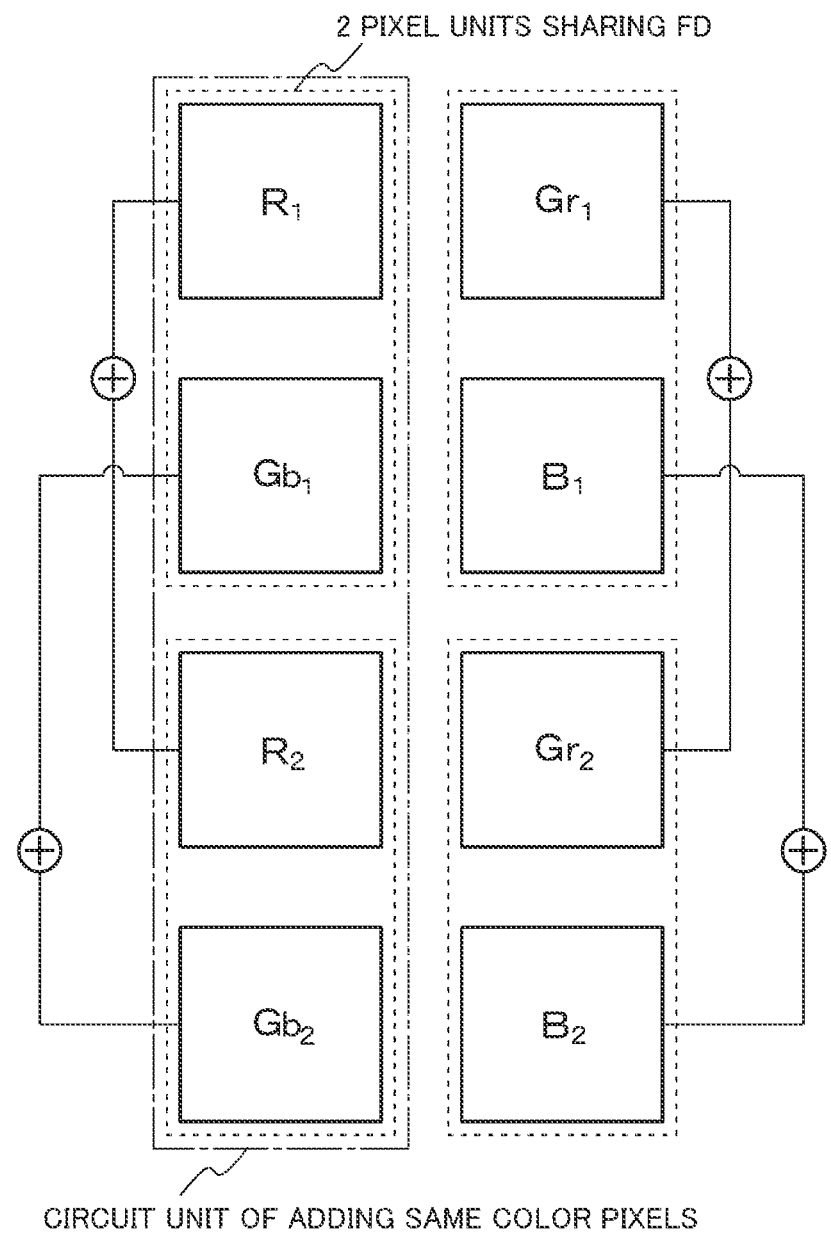
FIG. 21 is a diagram for describing the pixel addition in a Bayer pixel array.

A circuit unit of adding same color pixels is indicated by dashed lines in FIG. 21. In the correspondence with the pixel circuit in FIG. 20, the pixel 1 including the photodiode $PD_{11}$ corresponds to the pixel $R_1$, the pixel 2 including the photodiode $PD_{12}$ corresponds to the pixel $Gb_1$, the pixel 3 including the photodiode $PD_{21}$ corresponds to the pixel $R_2$, and the pixel 4 including the photodiode $PD_{22}$ corresponds to the pixel $Gb_2$ respectively.

Next the circuit operation in the still image mode without pixel addition and the circuit operation in the moving image mode with pixel addition in the pixel circuit according to the second embodiment will be described. In the pixel circuit according to the second embodiment, the two pixels of the first pixel unit 20A are assumed to be the pixel 1 and the pixel 2, and the two pixels of the second pixel unit 20B are assumed to be the pixel 3 and the pixel 4.

(Still Image Mode without Pixel Addition)

(1) In the Case of High Conversion Efficiency

Figure 22:
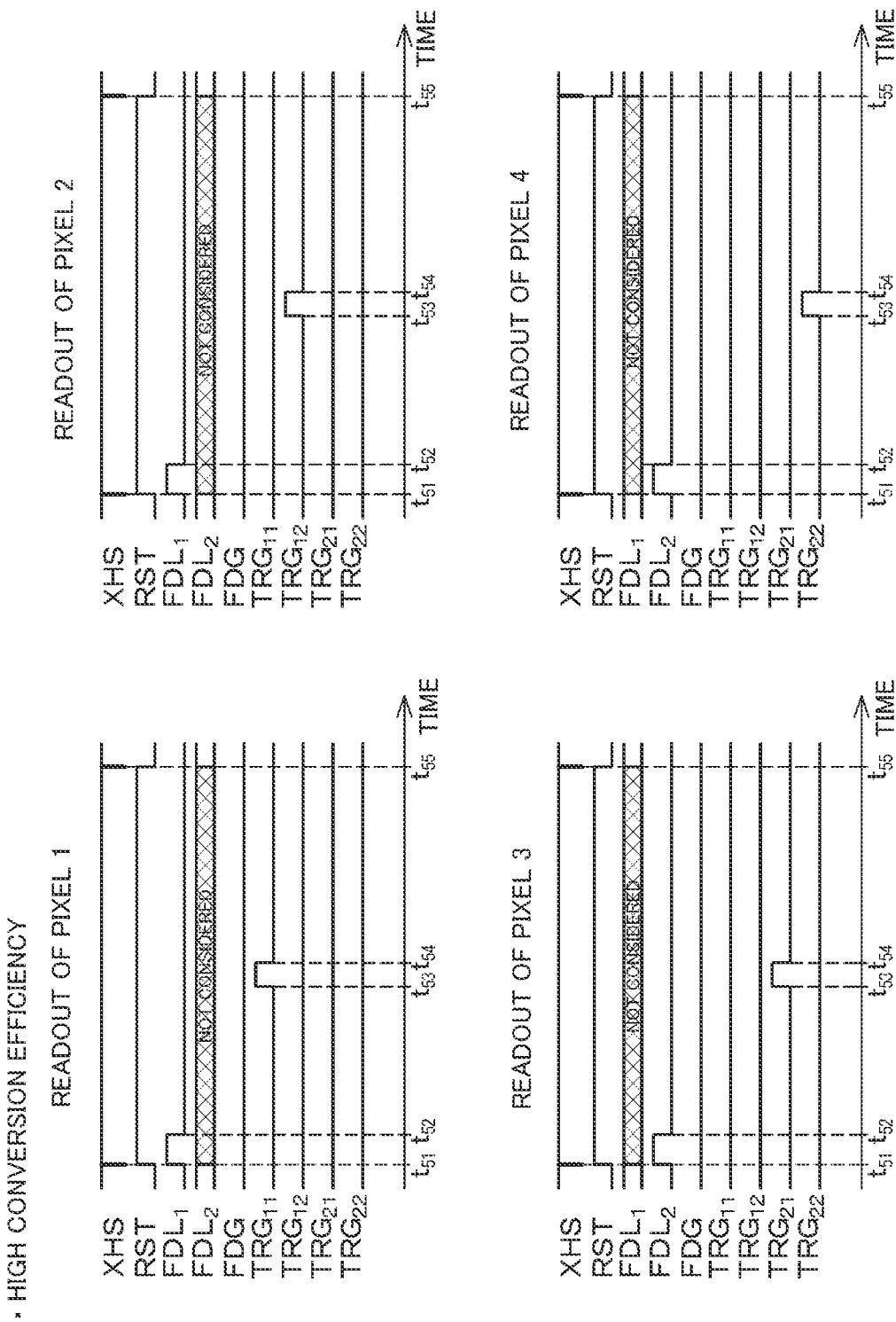
FIG. 22 indicates timing charts for describing operation in the case of high conversion efficiency in the still image mode without pixel addition.

FIG. 22 indicates timing charts for describing operation in the case of high conversion efficiency in the still image mode without pixel addition. In the timing charts in FIG. 22, a timing relationship of the horizontal synchronization signal XHS, the reset signal RST, the first switch signal $FDL_1$, the second switch signal $FDL_2$, the third switch signal FDG and the transfer signals $TRG_{11}$, $TRG_{12}$, $TRG_{21}$ and $TRG_{22}$ is indicated. This is the same for each timing cart to be described later.

Readout of Pixel 1

In the case of readout of the pixel 1, when the reset signal RST and the first switch signal $FDL_1$ change from the low level to the high level at time $t_{51}$, the reset transistor 23 and the first switch transistor $26_1$ become the conduction state. Thereby the floating diffusions $FD_1$ shared by the pixels of the first pixel unit 20A is reset. In this case, the level of the second switch signal $FDL_2$ is not considered.

Then after the first switch signal $FDL_1$ changes from the high level to the low level at time $t_{52}$, the transfer signal $TRG_{11}$ changes from the low level to the high level at time $t_{53}$, whereby the transfer transistor 22 of the pixel 1 becomes the conduction state, and the charges, which were photoelectrically converted by the photodiode $PD_{11}$, are read out. Then, after the transfer signal $TRG_{11}$ changes from the high level to the low level at time $t_{54}$, the reset signal RST changes from the high level to the low level at time $t_{55}$.

Readout of Pixel 2

In the case of readout of the pixel 2, when the reset signal RST and the first switch signal $FDL_1$ change from the low level to the high level at time $t_{51}$, the reset transistor 23 and the first switch transistor $26_1$ become the conduction state. Thereby the floating diffusion $FD_1$ shared by the pixels of the first pixel unit 20A is reset. In this case, the level of the second switch signal $FDL_2$ is not considered.

Then after the second switch signal $FDL_2$ changes from the high level to the low level at time $t_{52}$, the transfer signal $TRG_{12}$ changes from the low level to the high level at time $t_{53}$, whereby the transfer transistor 22 of the pixel 2 becomes the conduction state, and the charges, which were photoelectrically converted by the photodiode $PD_{12}$, are read out. Then, after the transfer signal $TRG_{12}$ changes from the high level to the low level at time $t_{54}$, the reset signal RST changes from the high level to the low level at time $t_{55}$.

Readout of Pixel 3

In the case of readout of the pixel 3, when the reset signal RST and the second switch signal $FDL_1$ change from the low level to the high level at time $t_{51}$, the reset transistor 23 and the second switch transistor $26_2$ become the conduction state. Thereby the floating diffusion $FD_2$ shared by the pixels of the second pixel unit 20B is reset. In this case, the level of the first switch signal $FDL_1$ is not considered.

Then after the second switch signal $FDL_2$ changes from the high level to the low level at time $t_{52}$, the transfer signal $TRG_{21}$ changes from the low level to the high level at time $t_{53}$, whereby the transfer transistor 22 of the pixel 2 becomes the conduction state, and the charges, which were photoelectrically converted by the photodiode $PD_{21}$, are read out. Then after the transfer signal $TRG_{21}$ changes from the high level to the low level at time $t_{54}$, the reset signal RST changes from the high level to the low level at time $t_{55}$.

Readout of Pixel 4

In the case of readout of the pixel 4, when the reset signal RST and the second switch signal $FDL_1$ change from the low level to the high level at time $t_{51}$, the reset transistor 23 and the second switch transistor $26_2$ become the conduction state. Thereby the floating diffusion $FD_2$ shared by the pixels of the second pixel unit 20B is reset. In this case, the level of the first switch signal $FDL_1$ is not considered.

Then after the second switch signal $FDL_2$ changes from the high level to the low level at time $t_{52}$, the transfer signal $TRG_{22}$ changes from the low level to the high level at time $t_{53}$, whereby the transfer transistor 22 of the pixel 2 becomes the conduction state, and the charges, which were photoelectrically converted by the photodiode $PD_{22}$, are read out. Then, after the transfer signal $TRG_{22}$ changes from the high level to the low level at time $t_{54}$, the reset signal RST changes from the high level to the low level at time $t_{55}$.

(2) In the Case of Intermediate Conversion Efficiency

Figure 23:
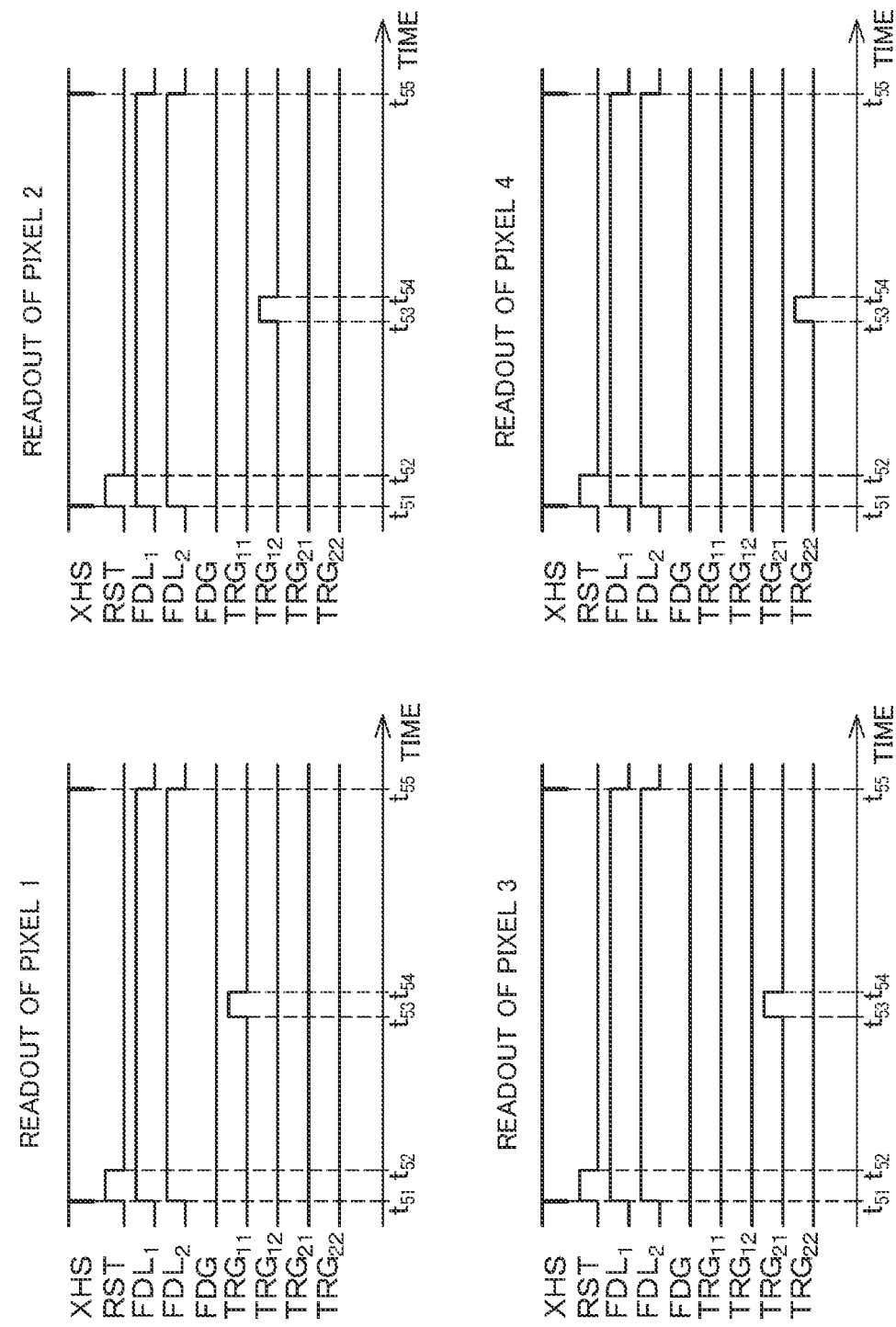
FIG. 23 indicates timing charts for describing operation in the case of intermediate conversion efficiency in the still image mode without pixel addition.

FIG. 23 indicates timing charts for describing operation in the case of high conversion efficiency in the still image mode without pixel addition.

Readout of Pixel 1

In the case of readout of the pixel 1, when the reset signal RST, the first switch signal $FDL_1$ and the second switch signal $FDL_2$ change from the low level to the high level at time $t_{51}$, the reset transistor 23, the first switch transistor $26_1$ and the second switch transistor $26_2$ become the conduction state. Thereby the floating diffusion $FD_1$ shared by the pixels of the first pixel unit 20A and the floating diffusion $FD_2$ shared by the pixels of the second pixel unit 20B are reset.

Then after the reset signal RST changes from the high level to the low level at time $t_{52}$, the transfer signal $TRG_{11}$ changes from the low level to the high level at time $t_{53}$, whereby the transfer transistor 22 of the pixel 1 becomes the conduction state, and the charges, which were photoelectrically converted by the photodiode $PD_{11}$, are read out. Then, after the transfer signal $TRG_{11}$ changes from the high level to the low level at time $t_{54}$, the reset signal RST changes from the high level to the low level at time $t_{55}$.

Readout of Pixel 2

In the case of readout of the pixel 2, when the reset signal RST, the first switch signal $FDL_1$ and the second switch signal $FDL_2$ change from the low level to the high level at time $t_{51}$, the reset transistor 23, the first switch transistor $26_1$ and the second switch transistor $26_2$ become the conduction state. Thereby the floating diffusion $FD_1$ shared by the pixels of the first pixel unit 20A and the floating diffusion $FD_2$ shared by the pixels of the second pixel unit 20B are reset.

Then after the reset signal RST changes from the high level to the low level at time $t_{52}$, the transfer signal $TRG_{12}$ changes from the low level to the high level at time $t_{53}$, whereby the transfer transistor 22 of the pixel 2 becomes the conduction state, and charges, which were photoelectrically converted by the photodiode $PD_{12}$ are read out. Then, after the transfer signal $TRG_{12}$ changes from the high level to the low level at time $t_{54}$, the reset signal RST changes from the high level to the low level at time $t_{55}$.

Readout of Pixel 3

In the case of readout of the pixel 3, when the reset signal RST, the first switch signal $FDL_1$ and the second switch signal $FDL_2$ change from the low level to the high level at time $t_{51}$, the reset transistor 23, the first switch transistor $26_1$ and the second switch transistor $26_2$ become the conduction state. Thereby the floating diffusion $FD_1$ shared by the pixels of the first pixel unit 20A and the floating diffusion $FD_2$ shared by the pixels of the second pixel unit 20B are reset.

After the reset signal RST changes from the high level to the low level at time $t_{52}$, the transfer signal $TRG_{21}$ changes from the low level to the high level at time $t_{53}$, whereby the transfer transistor 22 of the pixel 2 becomes the conduction state, and charges, which were photoelectrically converted by the photodiode $PD_{21}$, are read out. Then, after the transfer signal $TRG_{21}$ changes from the high level to the low level at time $t_{54}$, the reset signal RST changes from the high level to the low level at time $t_{55}$.

Readout of Pixel 4

In the case of readout of the pixel 4, when the reset signal RST, the first switch signal $FDL_1$ and the second switch signal $FDL_2$ change from the low level to the high level at time $t_{51}$, the reset transistor 23, the first switch transistor $26_1$ and the second switch transistor $26_2$ become the conduction state. Thereby the floating diffusion $FD_1$ shared by the pixels of the first pixel unit 20A and the floating diffusion $FD_2$ shared by the pixels of the second pixel unit 20B are reset.

Then after the reset signal RST changes from the high level to the low level at time $t_{52}$, the transfer signal $TRG_{22}$ changes from the low level to the high level at time $t_{53}$, whereby the transfer transistor 22 of the pixel 2 becomes the conduction state, and the charges, which were photoelectrically converted by the photodiode $PD_{22}$, are readout. Then after the transfer signal $TRG_{22}$ changes from the high level to the low level at time $t_{54}$, the reset signal RST changes from the high level to the low level at time $t_{55}$.

(3) In the Case of Low Conversion Efficiency

Figure 24:
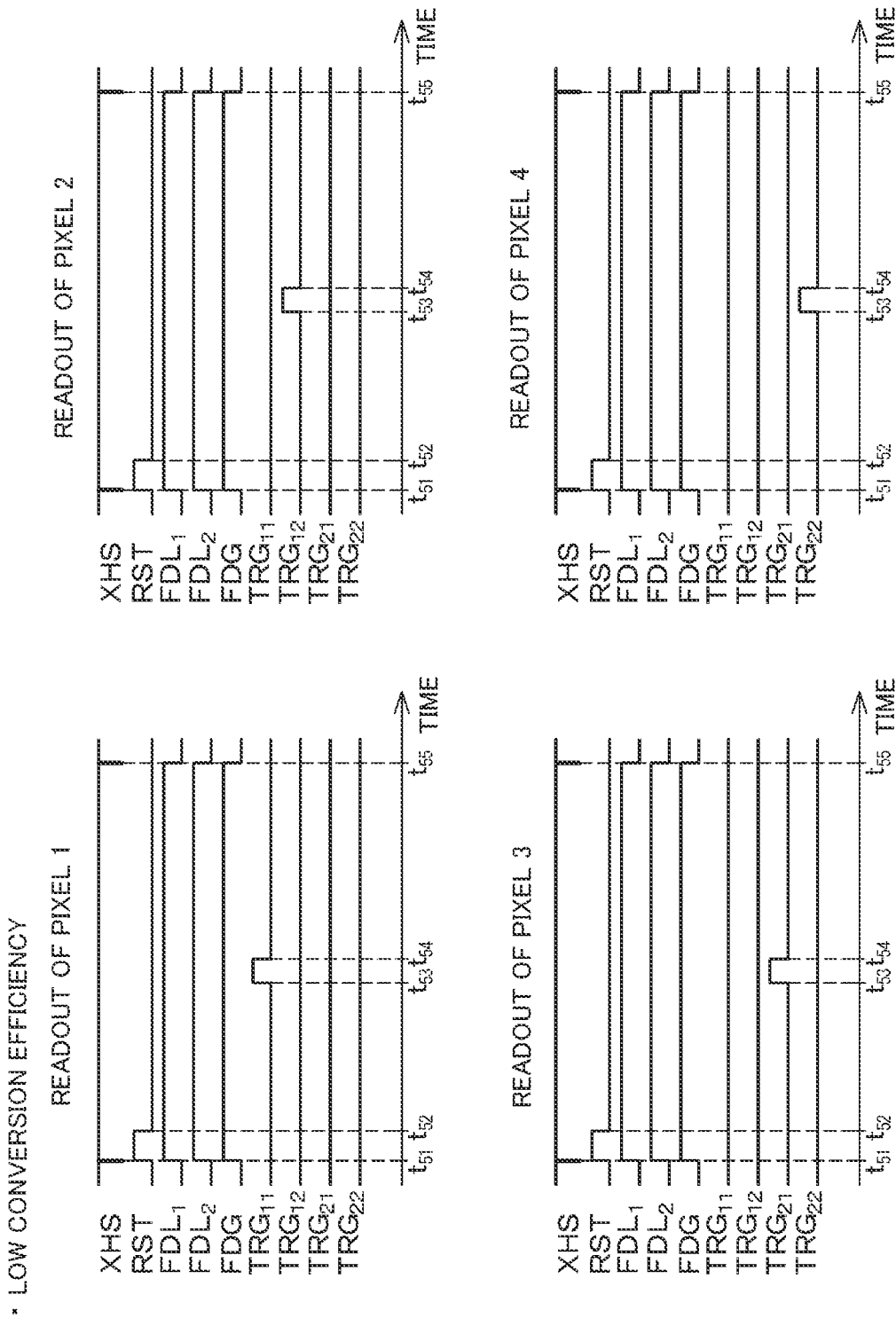
FIG. 24 indicates timing charts for describing operation in the case of low conversion efficiency in the still image mode without pixel addition.

FIG. 24 indicates timing charts for describing operation in the case of low conversion efficiency in the still image mode without pixel addition.

Readout of Pixel 1

In the case of readout of the pixel 1, when the reset signal RST, the first switch signal $FDL_1$, the second switch signal $FDL_2$ and the third switch signal FDG change from the low level to the high level at time $t_{51}$, the reset transistor 23, the first switch transistor $26_1$, the second switch transistor $26_2$ and the third switch transistor 27 become the conduction state.

Thereby the floating diffusion $FD_1$ shared by the pixels of the first pixel unit 20A and the floating diffusion $FD_2$ shared by the pixels of the second pixel unit 20B are reset. Further, the capacitive element $C_{11}$ of the pixel 1, the capacitive element $C_{12}$ of the pixel 2, the capacitive element $C_{21}$ of the pixel 3 and the capacitive element $C_{22}$ of the pixel 4 are connected to the node $FD_s$.

Then after the reset signal RST changes from the high level to the low level at time $t_{52}$, the transfer signal $TRG_{11}$ changes from the low level to the high level at time $t_{53}$, whereby the transfer transistor 22 of the pixel 1 becomes the conduction state, and the charges, which were photoelectrically converted by the photodiode $PD_{11}$, are read out. Then after the transfer signal $TRG_{11}$ changes from the high level to the low level at time $t_{54}$, the reset signal RST changes from the high level to the low level at time $t_{55}$.

Readout of Pixel 2

In the case of readout of the pixel 2, when the reset signal RST, the first switch signal $FDL_1$, the second switch signal $FDL_2$ and the third switch signal FDG change from the low level to the high level at time $t_{51}$, the reset transistor 23, the first switch transistor $26_1$, the second switch transistor $26_2$ and the third switch transistor 27 become the conduction state.

Thereby the floating diffusion $FD_1$ shared by the pixels of the first pixel unit 20A and the floating diffusion $FD_2$ shared by the pixels of the second pixel unit 20B are reset. Further, the capacitive element $C_{11}$ of the pixel 1, the capacitive element $C_{12}$ of the pixel 2, the capacitive element $C_{21}$ of the pixel 3, and the capacitive element $C_{22}$ of the pixel 4 are connected to the node $FD_s$.

Then after the reset signal RST changes from the high level to the low level at time $t_{52}$, the transfer signal $TRG_{12}$ changes from the low level to the high level at time $t_{53}$, whereby the transfer transistor 22 of the pixel 2 becomes the conduction state, and charges, which were photoelectrically converted by the photodiode $PD_{12}$, are read out. Then after the transfer signal $TRG_{12}$ changes from the high level to the low level at time $t_{54}$, the reset signal RST changes from the high level to the low level at time $t_{55}$.

Readout of Pixel 3

In the case of readout of the pixel 3, when the reset signal RST, the first switch signal $FDL_1$, the second switch signal $FDL_2$ and the third switch signal FDG change from the low level to the high level at time $t_{51}$, the reset transistor 23, the first switch transistor $26_1$, the second switch transistor $26_2$ and the third switch transistor 27 become the conduction state.

Thereby the floating diffusion $FD_1$ shared by the pixels of the first pixel unit 20A and the floating diffusion $FD_2$ shared by the pixels of the second pixel unit 20B are reset. Further, the capacitive element $C_{11}$ of the pixel 1, the capacitive element $C_{12}$ of the pixel 2, the capacitive element $C_{21}$ of the pixel 3, and the capacitive element $C_{22}$ of the pixel 4 are connected to the node $FD_s$.

Then after the reset signal RST changes from the high level to the low level at time $t_{52}$, the transfer signal $TRG_{21}$ changes from the low level to the high level at the time $t_{53}$, whereby the transfer transistor 22 of the pixel 2 becomes the conduction state, and the charges, which were photoelectrically converted by the photodiode $PD_{21}$, are read out. Then after the transfer signal $TRG_{21}$ changes from the high level to the low level at time $t_{54}$, the reset signal RST changes from the high level to the low level at time $t_{55}$.

Readout of Pixel 4

In the case of readout of the pixel 4, when the reset signal RST, the first switch signal $FDL_1$, the second switch signal $FDL_2$ and the third switch signal FDG change from the low level to the high level at time $t_{51}$, the reset transistor 23, the first switch transistor $26_1$, the second switch transistor $26_2$ and the third switch transistor 27 become the conduction state.

Thereby the floating diffusion $FD_1$ shared by the pixels of the first pixel unit 20A and the floating diffusion $FD_2$ shared by the pixels of the second pixel unit 20B are reset. Further, the capacitive element CH of the pixel 1, the capacitive element $C_{12}$ of the pixel 2, the capacitive element $C_{21}$ of the pixel 3, and the capacitive element $C_{22}$ of the pixel 4 are connected to the node $FD_s$.

Then after the reset signal RST changes from the high level to the low level at time $t_{52}$, the transfer signal $TRG_{22}$ changes from the low level to the high level at time $t_{53}$, whereby the transfer transistor 22 of the pixel 2 becomes the conduction state, and charges, which were photoelectrically converted by the photodiode $PD_{22}$, are read out. Then after the transfer signal $TRG_{22}$ changes from the high level to the low level at time $t_{54}$, the reset signal RST changes from the high level to the low level at time $t_{55}$.

As described above, in the case of the pixel circuit according to the second embodiment as well, just like the case of the pixel circuit according to the first embodiment, the conversion efficiency of the floating diffusions $FD_1$ and $FD_2$ shared by the pixels can be switched in three steps: high/intermediate/low, in the readout mode without pixel addition (still image mode).

(Moving Image Mode with Pixel Addition)

Circuit operation in the moving image mode with pixel addition will be described next. In the moving image mode with pixel addition, addition of the pixel 1 and the pixel 3 and addition readout of the pixel 2 and the pixel 4 are performed at intermediate conversion efficiency, and addition of the pixel 1 and the pixel 3 and addition readout of the pixel 2 and the pixel 4 are performed at low conversion efficiency.

In the moving image mode with pixel addition, the addition readout of the pixel 1 and the pixel 3 is addition readout of respective charges of the photodiode $PD_{11}$ and the photodiode $PD_{21}$, and the addition readout of the pixel 2 and the pixel 4 is addition readout of respective charges of the photodiode $PD_{12}$ and the photodiode $PD_{22}$.

Addition Readout of Pixel 1 and Pixel 3 at Intermediate Conversion Efficiency

FIG. 25A indicates a timing chart for describing operation in the case of addition readout of the pixel 1 and the pixel 3 at intermediate conversion efficiency.

When the reset signal RST, the first switch signal $FDL_1$ and the second switch signal $FDL_2$ change from the low level to the high level at time $t_{61}$, the reset transistor 23, the first switch transistor $26_1$ and the second switch transistor $26_2$ become the conduction state. Thereby the floating diffusion $FD_1$ shared by the pixels of the first pixel unit 20A and the floating diffusion $FD_2$ shared by the pixels of the second pixel unit 20B are reset.

Then after the reset signal RST changes from the high level to the low level at time to, the transfer signal $TRG_{11}$ of the pixel 1 and the transfer signal $TRG_{21}$ of the pixel 3 both change from the low level to the high level at time to, whereby the transfer transistor 22 of the pixel 1 and the transfer transistor 22 of the pixel 3 both become the conduction state. Thereby addition readout of the charges is performed between the photodiode $PD_{11}$ of the pixel 1 and the photodiode $PD_{21}$ of the pixel 3. In other words, in FIG. 21, the addition readout of the pixel signals is performed between the pixel $R_1$ and the pixel $R_2$ having a same color. Then after the transfer signals $TRG_{11}$ and $TRG_{21}$ change from the high level to the low level at time $t_{64}$, the first switch signal $FDL_1$ and the second switch signal $FDL_2$ change from the high level to the low level at time $t_{65}$.

Addition Readout of Pixel 2 and Pixel 4 at Intermediate Conversion Efficiency

FIG. 25B indicates a timing chart for describing operation in the case of addition readout of the pixel 2 and the pixel 4 at intermediate conversion efficiency.

When the reset signal RST, the first switch signal $FDL_1$ and the second switch signal $FDL_2$ change from the low level to the high level at time $t_{61}$, the reset transistor 23, the first switch transistor $26_1$ and the second switch transistor $26_2$ become the conduction state. Thereby the floating diffusion $FD_1$ shared by the pixels of the first pixel unit 20A and the floating diffusion $FD_2$ shared by the pixels of the second pixel unit 20B are reset.

Then after the reset signal RST changes from the high level to the low level at time $t_{62}$, the transfer signal $TRG_{12}$ of the pixel 2 and the transfer signal $TRG_{22}$ of the pixel 4 both change from the low level to the high level at time $t_{63}$, whereby the transfer transistor 22 of the pixel 1 and the transfer transistor 22 of the pixel 3 both become the conduction state. Thereby addition readout of the charges is performed between the photodiode $PD_{12}$ of the pixel 2 and the photodiode $PD_{22}$ of the pixel 4. In other words, in FIG. 21, the addition readout of the pixel signals is performed between the pixel $Gb_1$ and the pixel $Gb_2$ having a same color. Then after the transfer signals $TRG_{11}$ and $TRG_{21}$ change from the high level to the low level at time $t_{64}$, the first switch signal $FDL_1$ and the second switch signal $FDL_2$ change from the high level to the low level at time $t_{65}$.

Addition Readout of Pixel 1 and Pixel 3 at Low Conversion Efficiency

FIG. 26A indicates a timing chart for describing operation in the case of addition readout of the pixel 1 and pixel 3 at low conversion efficiency.

When the reset signal RST, the first switch signal $FDL_1$, the second switch signal $FDL_2$ and the third switch signal FDG change from the low level to the high level at time $t_{61}$, the reset transistor 23, the first switch transistor $26_1$, the second switch transistor $26_2$ and the third switch transistor 27 become the conduction state. Thereby the floating diffusion $FD_1$ shared by the pixels of the first pixel unit 20A and the floating diffusion $FD_2$ shared by the pixels of the second pixel unit 20B are reset. Further, the capacitive element $C_{11}$ of the pixel 1, the capacitive element $C_{12}$ of the pixel 2, the capacitive element $C_{21}$ of the pixel 3 and the capacitive element $C_{22}$ of the pixel 4 are connected to the node $FD_s$.

Then after the reset signal RST changes from the high level to the low level at time $t_{62}$, the transfer signal $TRG_{11}$ of the pixel 1 and the transfer signal $TRG_{21}$ of the pixel 3 both change from the low level to the high level at time $t_{63}$, whereby the transfer transistor 22 of the pixel 1 and the transfer transistor 22 of the pixel 3 both become the conduction state. Thereby addition readout of pixel signals is performed between the photodiode $PD_{11}$ of the pixel 1 and the photodiode $PD_{21}$ of the pixel 3, that is, between the pixel $R_1$ and the pixel $R_2$ having a same color. Then after the transfer signals $TRG_{11}$ and $TRG_{21}$ change from the high level to the low level at time $t_{64}$, the first switch signal $FDL_1$ and the second switch signal $FDL_2$ change from the high level to the low level at time $t_{65}$.

Addition Readout of Pixel 2 and Pixel 4 at Low Conversion Efficiency

FIG. 26B indicates a timing cart for describing operation in the case of addition readout of the pixel 2 and the pixel 4 at low conversion efficiency.

When the reset signal RST, the first switch signal $FDL_1$, the second switch signal $FDL_2$ and the third switch signal FDG change from the low level to the high level at time $t_{61}$, the reset transistor 23, the first switch transistor $26_1$, the second switch transistor $26_2$ and the third switch transistor 27 become the conduction state. Thereby the floating diffusion $FD_1$ shared by the pixels of the first pixel unit 20A and the floating diffusion $FD_2$ shared by the pixels of the second pixel unit 20B are reset. Further, the capacitive element $C_{11}$ of the pixel 1, the capacitive element $C_{12}$ of the pixel 2, the capacitive element $C_{21}$ of the pixel 3 and the capacitive element $C_{22}$ of the pixel 4 are connected to the node $FD_s$.

Then after the reset signal RST changes from the high level to the low level at time $t_{82}$, the transfer signal $TRG_{12}$ of the pixel 2 and the transfer signal $TRG_{22}$ of the pixel 4 both change from the low level to the high level at time to, whereby the transfer transistor 22 of the pixel 2 and the transfer transistor 22 of the pixel 4 both become the conduction state. Thereby addition readout of pixel signals is performed between the photodiode $PD_{12}$ of the pixel 2 and the photodiode $PD_{22}$ of the pixel 4, that is, between the pixel $Gb_1$ and the pixel $Gb_2$ having a same color. Then after the transfer signals $TRG_{12}$ and $TRG_{22}$ change from the high level to the low level at time to, the first switch signal $FDL_1$ and the second switch signal $FDL_2$ change from the high level to the low level at time to.

As described above, in the case of the pixel circuit according to the second embodiment as well, just like the case of the pixel circuit according to the first embodiment, the conversion efficiency of the floating diffusions $FD_1$ and $FD_2$ shared by pixels can be switched in two steps: intermediate/low, in the readout mode with pixel addition (moving image mode).

(Layout of Pixel Circuit)

Figure 27:
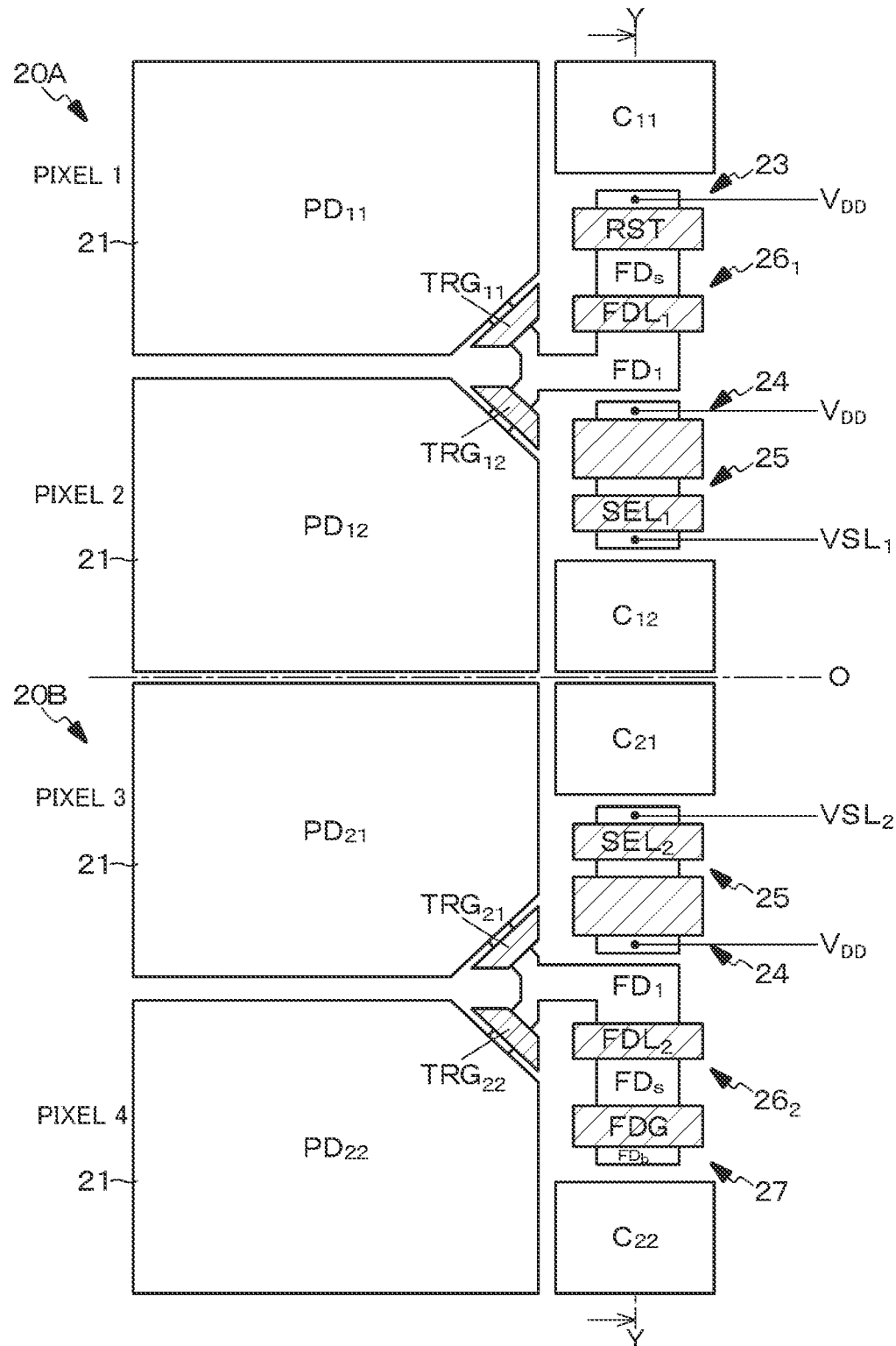
FIG. 27 is a plan view depicting a layout of the pixel circuit according to the second embodiment.
Figure 28:
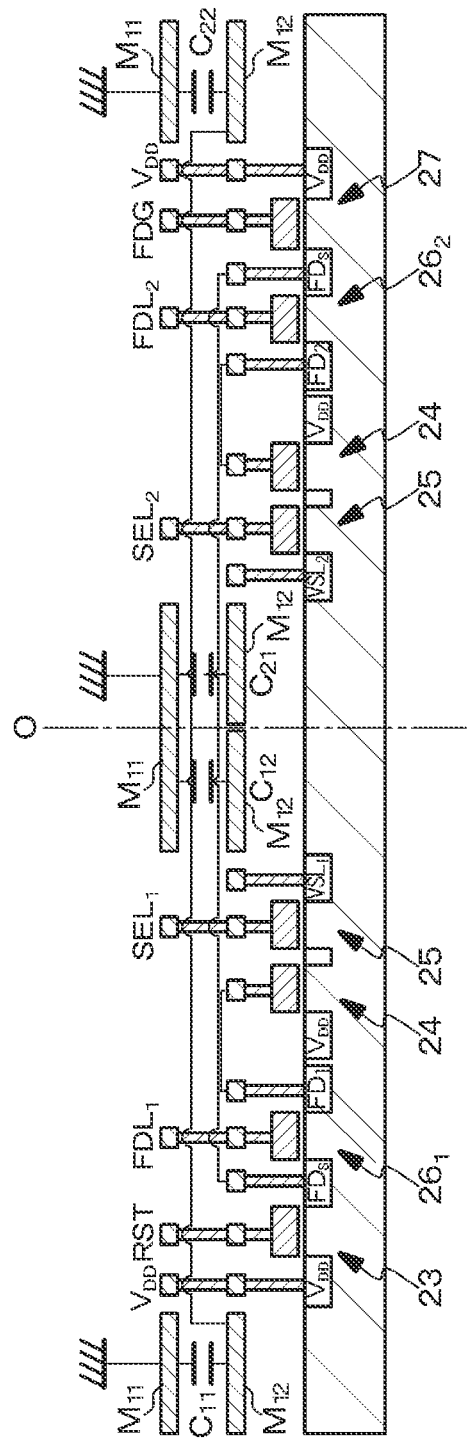
FIG. 28 is a cross-sectional view in the arrow direction along the Y-Y line in FIG. 27.

FIG. 27 is a layout diagram (plan view) of the pixel circuits according to the second embodiment, and FIG. 28 is a cross-sectional view in the arrow direction along the Y-Y line in FIG. 27. In FIG. 27, a gate electrode of each transistor is shaded by hatched lines to make understanding easier.

The composing elements of the pixel 1 and the pixel 2, constituting the first pixel unit 20A and composing elements of the pixel 3 and pixel 4 constituting the second pixel unit 20B have a pixel layout ensuring symmetry with respect to the center line O between the first pixel unit 20A and the second pixel unit 20B.

The capacitive elements $C_{11}$ and $C_{12}$ of the first pixel unit 20A and the capacitive elements $C_{21}$ and $C_{22}$ of the second pixel unit 20B, which determine the low conversion efficiency, can be configured to one capacitive element that is common for the first pixel unit 20A and the second pixel unit 20B. However, it is preferable to dispose the capacitive elements divided into the pixel 1, pixel 2, pixel 3 and pixel 4 in terms of symmetry of the pixel layout, ensuring uniformity of the pixel characteristics.

As illustrated in FIG. 27, the capacitive element $C_{11}$ of the pixel 1, the capacitive element $C_{12}$ of the pixel 2, the capacitive element $C_{21}$ of the pixel 3, and the capacitive element $C_{22}$ of the pixel 4 can be implemented by coupling capacitance between the metal line $M_{11}$ and the metal line $M_{12}$ respectively. However, this implementation is not limited to the coupling capacitance between the metal lines $M_{11}$ and $M_{12}$, but capacitive elements using oxide film, for example, may be used.

Due to the same reason as the case of the pixel circuit according to the first embodiment, it is preferable that each pixel structure of the first pixel unit 20A and the second pixel unit 20B is the back-illuminated pixel structure, which has no such restriction on the positions of the metal lines $M_{11}$ and $M_{12}$, as in the case of the front-illuminated pixel structure. Then the metal lines $M_{11}$ and $M_{12}$ constituting the capacitive elements $C_{11}$, $C_{12}$, $C_{21}$ and $C_{22}$ can be disposed protruding into the region of the photodiode 21, hence the capacitive elements $C_{11}$, $C_{12}$, $C_{21}$ and $C_{22}$ having larger capacitance values can be implemented.

Modification

While the technique according to the present disclosure has been described with reference to the preferred embodiments, the technique according to the present disclosure is not limited to these embodiments. The configuration and structure of the imaging apparatus described in the embodiments are examples, and may be changed appropriately.

For example, in the above embodiments, the case of applying to a CMOS image sensor in which the pixels 2 are disposed in a matrix was described as an example, but the technique according to the present disclosure is not limited to the application to the CMOS image sensor. In other words, the technique according to the present disclosure can be applied to an X-Y address type imaging apparatus in general, where the pixels 2 are two-dimensionally disposed in a matrix.

Applications

Figure 29:
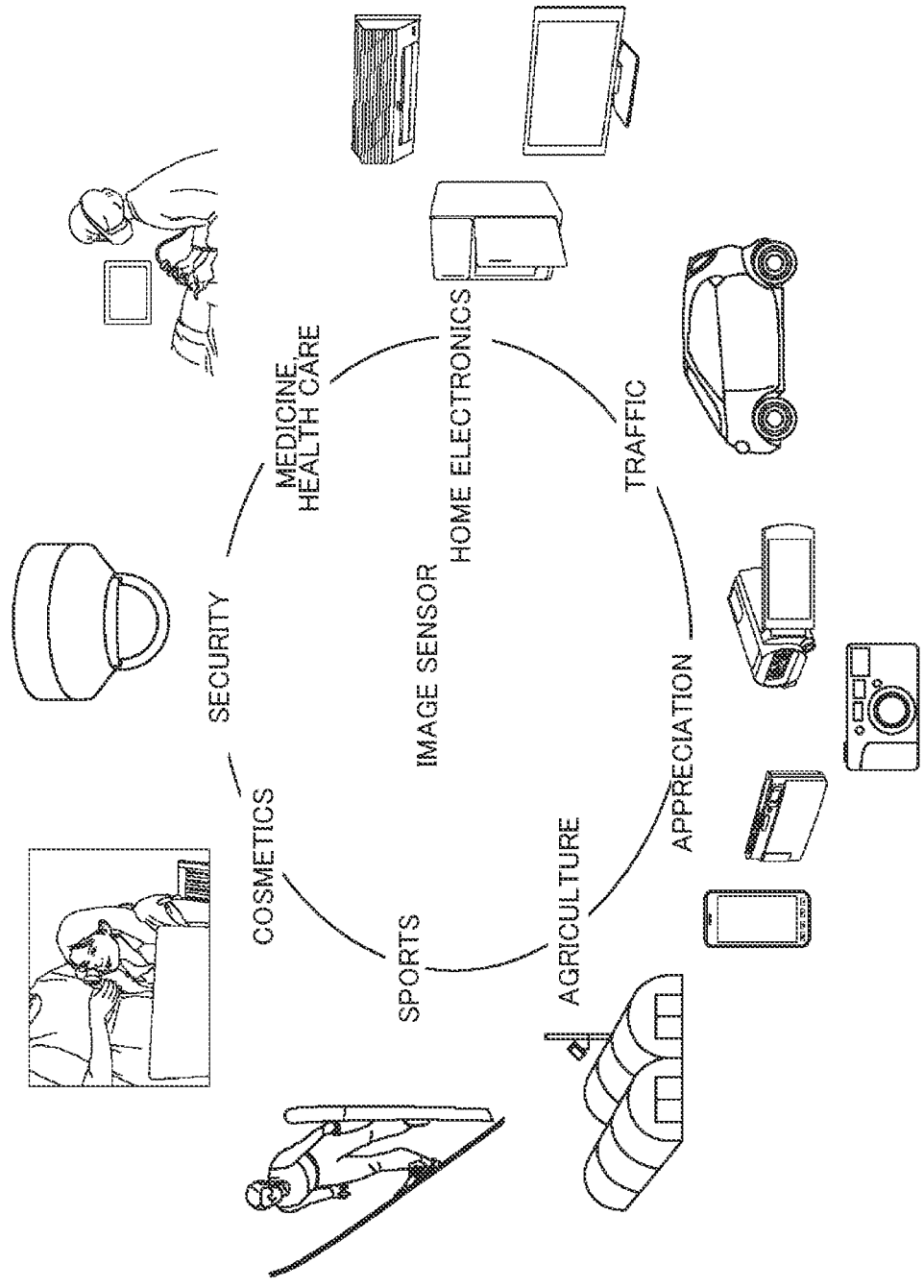
FIG. 29 is a diagram illustrating application examples of the technique according to the present disclosure.

The imaging apparatus according to the embodiments described above can be applied to various devices to sense such light as visible light, infrared light, ultraviolet light and X-rays, as illustrated in FIG. 29. Specific examples of these various devices will be listed below.

- a device used for capturing images for appreciation, such as a digital camera and portable equipment with camera functions
- a device used for traffic purposes, such as an on-vehicle sensor that captures images of the front area, back area, surrounding area, interior of the vehicle, and the like, for safe driving (e.g. automatic stopping) and to recognize the state of the driver, a monitoring camera that monitors vehicles in travel and roads, and a distance measurement sensor that measures the distance between vehicles and the like
- a device used for home electronic appliances (e.g. TV, refrigerator, air conditioner) that captures images of a gesture of a user so as to perform an operation in accordance with the gesture
- a device used for medical care and health care, such as an endoscope and device to perform angiography by receiving infrared light
- a device used for security, such as a monitoring camera for crime prevention and a camera for personal authentication
- a device used for cosmetics, such as a skin measuring device that captures an image of the skin, and a microscope that captures an image of the scalp
- a device used for sports, such as an action camera and a wearable camera for sports purposes
- a device used for agriculture, such as a camera for monitoring the state of a farm and crops Applicable Example The technique according to the present disclosure can be applied to various products. Specifically, this technique can be applied to an imaging system, such as digital still camera and a video camera, a portable terminal device having an imaging function, such as a portable telephone, and an electronic device, such as a copier which uses an imaging apparatus for an image reading unit. A case of applying this technique to an imaging system, such as a digital still camera and a video camera, will be described.

[Imaging System]

Figure 30:
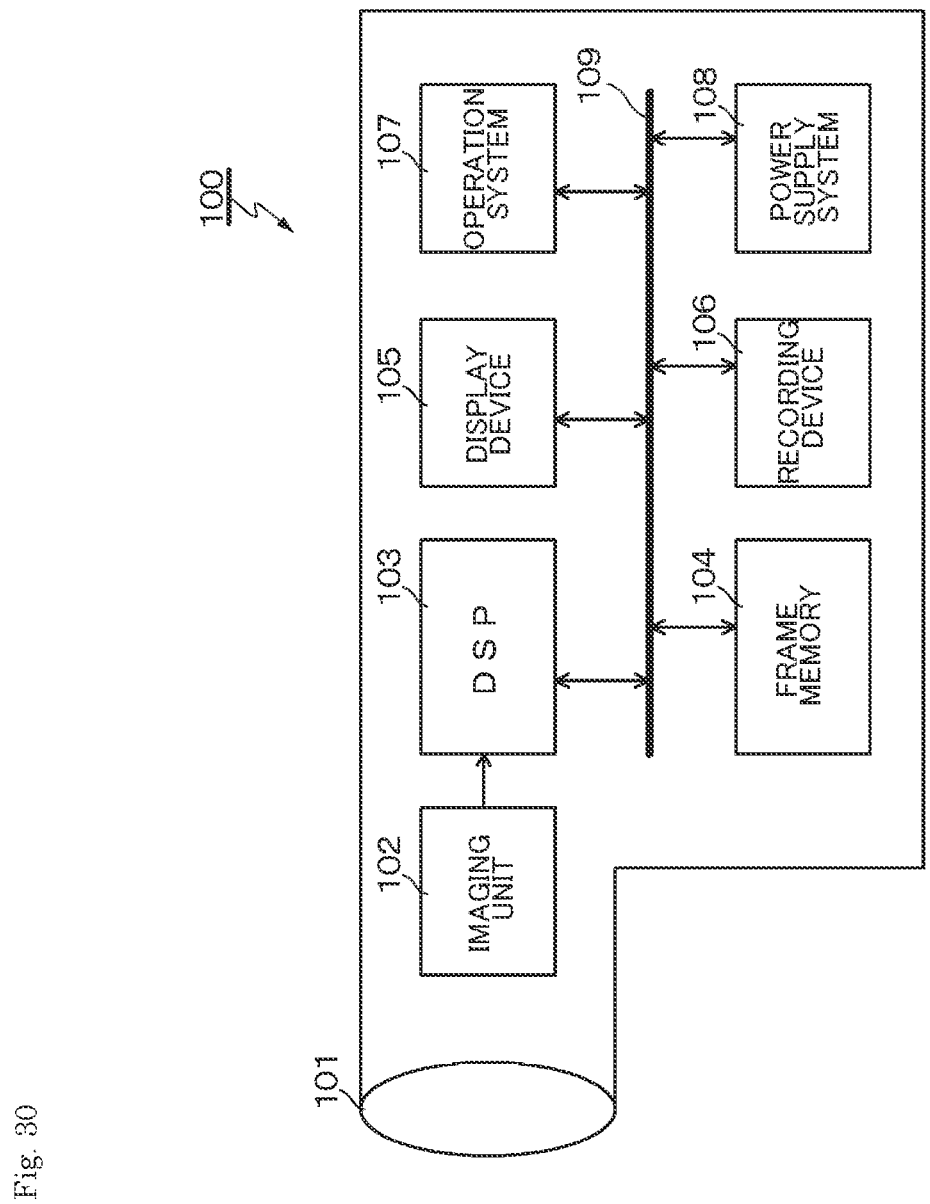
FIG. 30 is a block diagram depicting an overview of a configuration of an imaging system, which is an example of the electronic device of the present disclosure.

FIG. 30 is a block diagram depicting a configuration of an imaging system, which is an example of the electronic device. As illustrate din FIG. 30, the imaging system 100 of this example includes an imaging optical system 101 constituted of a lens group and the like, an imaging unit 102, a digital signal processor (DSP) circuit 103, a frame memory 104, a display device 105, a recording device 106, an operation system 107 and a power supply system 108. The DSP circuit 103, the frame memory 104, the display device 105, the recording device 106, the operation system 107 and the power supply system 108 are interconnected via a bus line 109.

The imaging optical system 101 receives the incident light (image light) from a subject, and forms an image on an imaging plane of the imaging unit 102. The imaging unit 102 converts the quantity of the incident light, of which image is formed on the imaging plane by the optical system 101, into electric signals in pixel units, and outputs the electric signals as pixel signals. The DSP circuit 103 performs camera signal processing in general, such as white balance processing, demosaic processing and gamma correction processing.

The frame memory 104 is used for storing data when necessary in the signal processing step in the DSP circuit 103. The display device 105 is constituted of a panel type display device, such as a liquid crystal display device and an organic electroluminescence (EL) display device, and displays a moving image or a still image captured by the imaging unit 102. The recording device 106 records a moving image or a still image captured by the imaging unit 102 in such a recording medium as a portable semiconductor memory, an optical disk and a hard disk drive (HDD).

The operation system 107 transmits operation instructions for various functions of this imaging system 100 according to the operation by the user. The power supply system 108 supplies power to the DSP circuit 103, the frame memory 104, the display device 105, the recording device 106 and the operation system 107 as the operation power supply of these supply targets.

In the imaging system 100 having the above mentioned configuration, the imaging apparatus according to the embodiment described above can be used as the imaging unit 102. By using this imaging apparatus as the imaging unit 102, the addition readout based on the FD addition can be performed even in a state other than the low conversion efficiency state.

Possible Configuration of Present Disclosure

The present disclosure may have the following configurations.

<<A. Imaging Apparatus>>

[A-1]

An imaging apparatus including a first pixel unit and a second pixel unit, each of which includes a floating diffusion that converts charges, transferred from a light-receiving unit, into voltage, and selectively performs pixel addition that adds pixel signals by electrically connecting the floating diffusions between pixels, wherein the first pixel unit includes: a first switch transistor of which one source/drain electrode is connected to a floating diffusion; and a reset transistor that is connected between another source/drain electrode of the first switch transistor and a power supply node, the second pixel unit includes: a second switch transistor of which one source/drain electrode is connected to a floating diffusion; a third switch transistor of which one source/drain electrode is connected to another source/drain electrode of the second switch transistor; and a capacitive element that is connected between another source/drain electrode of the third switch transistor and a reference potential node, and the respective other source/drain electrodes of the first switch transistor and the second switch transistor are electrically connected with each other.

[A-2]

The imaging apparatus according to the above [A-1], wherein in a case where the pixel addition is not performed, the first pixel unit or the second pixel unit implements high conversion efficiency for the conversion efficiency of the floating diffusion when the first switch transistor or the second switch transistor is in a non-conduction state.

[A-3]

The imaging apparatus according to the above [A-1], wherein in a case where the pixel addition is not performed, the first pixel unit and the second pixel unit implement intermediate conversion efficiency for the conversion efficiency of the floating diffusion when the first switch transistor and the second switch transistor are both in a non-conduction state.

[A-4]

The imaging apparatus according to the above [A-1], wherein in the case where the pixel addition is not performed, the first pixel unit and the second pixel unit implement low conversion efficiency for the conversion efficiency of the floating diffusion when the first switch transistor, the second switch transistor and the third switch transistor are all in a conduction state.

[A-5]
The imaging apparatus according to the above [A-1], wherein the first pixel unit and the second pixel unit perform the pixel addition and implement intermediate conversion efficiency for the conversion efficiency of the floating diffusion when the first switch transistor and the second switch transistor are both in a conduction state.

[A-6]
The imaging apparatus according to the above [A-1], wherein the first pixel unit and the second pixel unit perform the pixel addition and implement low conversion efficiency for the conversion efficiency of the floating diffusion when the first switch transistor, the second switch transistor and the third switch transistor are all in a conduction state.

[A-7]
The imaging apparatus according to any one of the above [A-1] to [A-6], wherein the capacitive element is disposed so as to be divided into respective pixels of the first pixel unit and the second pixel unit.

[A-8]
The imaging apparatus according to the above [A-7], wherein the capacitive element is implemented by coupling capacitance between metal lines.

[A-9]
The imaging apparatus according to any one of the above [A-1] to [A-8], wherein each of the first pixel unit and the second pixel unit is constituted of a plurality of pixels, and a floating diffusion is shared by the plurality of pixels.

[A-10]
The imaging apparatus according to the above [A-9], wherein the first pixel unit and the second pixel unit perform the pixel addition among pixels having a same color.

[A-11]
The imaging apparatus according to any one of the above [A-1] to [A-10], wherein composing elements of the first pixel unit and composing elements of the second pixel unit have a pixel layout ensuring symmetry with respect to the center line between the first pixel unit and the second pixel unit.

[A-12]
The imaging apparatus according to [A-11], wherein each floating diffusion of the first pixel unit and the second pixel unit is disposed at a position that is closer to the center line between the first pixel unit and the second pixel unit than each center of the first pixel unit and the second pixel unit respectively.

[A-13]
The imaging apparatus according to any one of the above [A-1] to [A-12], wherein each of the first pixel unit and the second pixel unit has a back-illuminated pixel structure.

<<B. Electronic Device>>
[B-1]
An electronic device equipped with an imaging apparatus, and the imaging apparatus includes a first pixel unit and a second pixel unit, each of which includes a floating diffusion that converts charges, transferred from a light-receiving unit, into voltage, and selectively performs pixel addition that adds pixel signals by electrically connecting the floating diffusions between pixels, wherein
the first pixel unit includes: a first switch transistor of which one source/drain electrode is connected to a floating diffusion; and a reset transistor that is connected between another source/drain electrode of the first switch transistor and a power supply node, the second pixel unit includes: a second switch transistor of which one source/drain electrode is connected to a floating diffusion; a third switch transistor of which one source/drain electrode is connected to another source/drain electrode of the second switch transistor; and a capacitive element that is connected between another source/drain electrode of the third switch transistor and a reference potential node, and the respective other source/drain electrodes of the first switch transistor and the second switch transistor are electrically connected with each other.

[B-2]
The electronic device according to the above [B-1], wherein in a case where the pixel addition is not performed, the first pixel unit or the second pixel unit implements high conversion efficiency for the conversion efficiency of the floating diffusion when the first switch transistor or the second switch transistor is in a non-conduction state.

[B-3]
The electronic device according to the above [B-1], wherein in a case where the pixel addition is not performed, the first pixel unit and the second pixel unit implement intermediate conversion efficiency for the conversion efficiency of the floating diffusion when the first switch transistor and the second switch transistor are both in a non-conduction state.

[B-4]
The electronic device according to the above [B-1], wherein in a case where the pixel addition is not performed, the first pixel unit and the second pixel unit implement low conversion efficiency for the conversion efficiency of the floating diffusion when the first switch transistor, the second switch transistor and the third switch transistor are all in a conduction state.

[B-5]
The electronic device according to the above [B-1], wherein the first pixel unit and the second pixel unit perform the pixel addition and implement intermediate conversion efficiency for the conversion efficiency of the floating diffusion when the first switch transistor and the second switch transistor are both in a conduction state.

[B-6]
The electronic device according to the above [B-1], wherein the first pixel unit and the second pixel unit perform the pixel addition and implement low conversion efficiency for the conversion efficiency of the floating diffusion when the first switch transistor, the second switch transistor and the third switch transistor are all in a conduction state.

[B-7]
The electronic device according to any one of the above [B-1] to [B-6}, wherein the capacitive element is disposed so as to be divided into respective pixels of the first pixel unit and the second pixel unit.

[B-8]
The electronic device according to the above [B-7], wherein the capacitive element is implemented by coupling capacitance between metal lines.

[B-9]
The electronic device according to any one of the above [B-1] to [B-8], wherein each of the first pixel unit and the second pixel unit is constituted of a plurality of pixels, and a floating diffusion is shared by the plurality of pixels.

[B-10]
The electronic device according to the above [B-9], wherein the first pixel unit and the second pixel unit perform the pixel addition among pixels having a same color.

[B-11]

The electronic device according to any one of the above [B-1] to [B-10], wherein composing elements of the first pixel unit and composing elements of the second pixel unit have a pixel layout ensuring symmetry with respect to the center line between the first pixel unit and the second pixel unit.

[B-12]

The electronic device according to the above [B-11], wherein each floating diffusion of the first pixel unit and the second pixel unit is disposed at a position that is closer to the center line between the first pixel unit and the second pixel unit than each center of the first pixel unit and the second pixel unit respectively.

[B-13]

The electronic device according to any one of the above [B-1] to [B-12], wherein each of the first pixel unit and the second pixel unit has a back-illuminated pixel structure.

REFERENCE SIGNS LIST

1 CMOS image sensor
2 Pixel
11 Pixel array unit
12 Row selection unit
13 Constant current source unit
14 Analog-digital conversion unit
15 Horizontal transfer scanning unit
16 Signal processing unit
17 Timing control unit
18 Horizontal transfer line
19 Reference signal generation unit
20A First pixel unit
20B Second pixel unit
21 Photodiode (photoelectric conversion portion)
22 Transfer transistor
23 Reset transistor
24 Amplification transistor
25 Selection transistor
$26_1$ First switch transistor
$26_2$ Second switch transistor
27 Third switch transistor
31 ($31_1$ to $31_w$) Pixel drive line
32 ($32_1$ to $32_n$) Vertical signal line
$C_1, C_2, C_{11}, C_{12}, C_{21}, C_{22}$ Capacitive element
FD ($FD_1, FD_2$) Floating diffusion

The invention claimed is:

1. A light-detecting device comprising:
a first pixel circuit including a photodiode, a first floating diffusion, a first switch transistor, and a reset transistor;
a second pixel circuit including a photodiode, a second floating diffusion, a second switch transistor, and a third switch transistor,
a wiring coupled to the first floating diffusion and the second floating diffusion; and
a first capacitor selectively coupled to the first floating diffusion and the second floating diffusion, wherein
the first floating diffusion is coupled to the second floating diffusion via the first switch transistor, the second switch transistor, and the wiring,
the first pixel circuit includes a first amplification transistor and a first selection transistor,
the second pixel circuit includes a second amplification transistor and a second selection transistor, and
the reset transistor, the first switch transistor, the first amplification transistor, and the first selection transistor are disposed along a first direction in a plan view.

2. The light-detecting device of claim 1, wherein at least one terminal of the first capacitor is disposed in a wiring layer.

3. The light-detecting device of claim 1, wherein the first floating diffusion and the second floating diffusion share a reset transistor.

4. The light-detecting device of claim 3, wherein a terminal of the reset transistor is coupled to a predetermined power supply voltage.

5. The light-detecting device of claim 1, further comprising:
a second capacitor selectively coupled to the first floating diffusion and the second floating diffusion.

6. The light-detecting device of claim 5, wherein at least one terminal of the second capacitor is disposed in a wiring layer.

7. The light-detecting device of claim 1, wherein the first selection transistor is coupled to a vertical signal line.

8. The light-detecting device of claim 7, wherein the first floating diffusion is coupled to a gate of the first amplification transistor, and the second floating diffusion is coupled to a gate of the second amplification transistor.

9. The light-detecting device of claim 1, wherein the photodiode included in the first pixel circuit is one of a first plurality of photodiodes in the first pixel circuit.

10. The light-detecting device of claim 9, wherein the photodiode included in the second pixel circuit is one of a second plurality of photodiodes in the second pixel circuit.

11. The light-detecting device of claim 10, wherein the first floating diffusion is shared by the first plurality of photodiodes and the second floating diffusion is shared by the second plurality of photodiodes.

12. The light-detecting device of claim 11, wherein the first plurality of photodiodes are coupled to the first floating diffusion through a corresponding first plurality of transfer transistors, and the second plurality of photodiodes are coupled to the second floating diffusion through a corresponding second plurality of transfer transistors.

13. The light-detecting device of claim 9, wherein the first plurality of photodiodes are coupled to the first floating diffusion through a corresponding first plurality of transfer transistors.

14. The light-detecting device claim 1, wherein the first floating diffusion and the second floating diffusion share a reset transistor, and a terminal of the reset transistor, a terminal of the first amplification transistor and a terminal of the second amplification transistor are coupled to a same predetermined power supply voltage.

15. The light-detecting device of claim 1, wherein the first capacitor is selectively coupled to the first floating diffusion via the third switch transistor, the wiring, and the first switch transistor, and is selectively coupled to the second floating diffusion via the second switch transistor.

* * * * *